(12) United States Patent
Lee et al.

(10) Patent No.: US 8,361,904 B2
(45) Date of Patent: Jan. 29, 2013

(54) SEMICONDUCTOR DEVICE HAVING FINE PATTERN WIRING LINES INTEGRALLY FORMED WITH CONTACT PLUG AND METHOD OF MANUFACTURING SAME

(75) Inventors: Dong-seok Lee, Suwon-si (KR); Seung-pil Chung, Seoul (KR); Ji-young Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 155 days.

(21) Appl. No.: 12/966,110

(22) Filed: Dec. 13, 2010

(65) Prior Publication Data

US 2011/0081778 A1 Apr. 7, 2011

Related U.S. Application Data

(60) Division of application No. 11/928,034, filed on Oct. 30, 2007, which is a continuation-in-part of application No. 11/367,437, filed on Mar. 6, 2006, now Pat. No. 7,473,647, which is a continuation of application No. 12/327,006, filed on Dec. 3, 2008, now Pat. No. 8,062,981.

(30) Foreign Application Priority Data

Apr. 19, 2005 (KR) .................. 10-2005-0032297
Jun. 15, 2007 (KR) .................. 10-2007-0059103

(51) Int. Cl.
*H01L 21/311* (2006.01)

(52) U.S. Cl. ............... 438/702; 438/717; 257/E21.039; 257/E21.586

(58) Field of Classification Search .................. 438/618, 438/622, 637, 669, 671, 672, 702, 717, 738, 438/740; 257/E21.039, E21.314, E21.586
See application file for complete search history.

(56) References Cited

U.S. PATENT DOCUMENTS

| | | | |
|---|---|---|---|
| 6,239,008 B1 | 5/2001 | Yu et al. | |
| 6,403,417 B1 | 6/2002 | Chien et al. | |
| 6,667,237 B1 | 12/2003 | Metzler | |
| 7,256,126 B1 | 8/2007 | Chen | |
| 2003/0027420 A1 | 2/2003 | Lai et al. | |
| 2003/0207584 A1 | 11/2003 | Sivakumar et al. | |
| 2004/0017989 A1 | 1/2004 | So | |
| 2006/0046484 A1 | 3/2006 | Abatchev et al. | |
| 2006/0263699 A1 | 11/2006 | Abatchev et al. | |

FOREIGN PATENT DOCUMENTS

| | | |
|---|---|---|
| JP | 2006261307 A | 9/2006 |
| KR | 100155880 B1 | 7/1998 |
| KR | 100165399 B1 | 9/1998 |
| KR | 1020000045452 A | 7/2000 |
| KR | 1020000084566 | 12/2000 |
| KR | 100574999 B1 | 4/2006 |

*Primary Examiner* — Matthew Landau
*Assistant Examiner* — Candice Chan
(74) *Attorney, Agent, or Firm* — Volentine & Whitt, PLLC

(57) ABSTRACT

A semiconductor device and method are disclosed in which an interlayer insulating layer is patterned using multiple overlaying masks to define the geometry of contact plugs and corresponding wiring layers separated by fine pitches.

7 Claims, 21 Drawing Sheets

SEMICONDUCTOR DEVICE HAVING FINE PATTERN WIRING LINES INTEGRALLY FORMED WITH CONTACT PLUG AND METHOD OF MANUFACTURING SAME

CROSS-REFERENCE TO RELATED PATENT APPLICATIONS

This is a divisional of application Ser. No. 11/928,034 filed on Oct. 30, 2007 which claims the benefit of Korean Patent Application No. 10-2007-0059103, filed on Jun. 15, 2007, which is a Continuation-In-Part (CIP) application to commonly assigned U.S. patent application Ser. No. 11/367,437 filed Mar. 6, 2006, now U.S. Pat. No. 7,473,647, which is the parent of application Ser. No. 12/327,006 filed Dec. 3, 2008, which claims the benefit of Korean Patent Application No. 10-2005-0032297 filed on Apr. 19, 2005, the collective disclosures of which are incorporated herein by reference in their entirety.

BACKGROUND OF THE INVENTION

1. Field of the Invention

The present invention relates to a semiconductor device having fine pattern wiring lines and a related method of manufacture. More particularly, the invention relates to a semiconductor device having fine pattern wiring lines having a fine pitch and contact plugs that respectively connect the wiring lines to an adjacent conductive region, and a related method of manufacture.

2. Description of the Related Art

The fabrication of highly integrated semiconductor devices requires the formation and use of ever more minute patterns and associated elements. That is, in order to integrate the numerous elements forming contemporary semiconductor devices into increasing small areas, the size of individual elements must be reduced and the separation distances between adjacent elements must also be reduced. In part, the reduction in element sizes and increasing density of related elements are enabled by reductions in the "pitch" of the conductive patterns connecting various elements. A pitch is generally defined by the sum of the width of a pattern itself, plus the width of the gap separating the pattern from adjacent patterns or related elements.

The required pitch (or pitches) defining the integration density of contemporary semiconductor devices is largely a product of over-arching design rules for individual semiconductor devices. In many instances, contemporary design rules are mandating pattern pitches that have reached the resolution and performance limits of existing photolithography equipment. For example, resolution restrictions for available photolithography equipment now limit the realizable size of fine pitch contact holes in very small (i.e., narrow) areas of a semiconductor substrate. Such practical limits on the definition and fabrication of contact holes in contemporary semiconductor devices is a function of minimum margins placed on the separation distance and alignment of adjacent contact holes. Existing photolithography resolution limits and restrictions simply can not form contact holes with finer pitches while maintaining acceptable design margins.

One common example of conventional pitch limits being reached may be found in the design and fabrication of adjacent bit lines in semiconductor memory devices. For example, the pitch between bit lines in certain highly integrated flash memory devices has abruptly decreased to a feature size in the range of 30 nm. Available photolithography equipment simply can not be used conventional manner to adequately form such features.

During the formation of "laterally" arranged bit lines in contemporary semiconductor memory devices, respective contact plugs are usually formed to "vertically" connect each bit line to an associated active region or some other element. The terms lateral and vertical are relative in nature and are used to facilitate description. Throughout the description that follows, no arbitrary geometry is mandated by the use of such descriptive terms. After the contact plugs have been formed, the bit lines are formed in electrical contact respective contact plug(s). During this fabrication overlay of laterally running bit lines over an arrangement of previously formed and vertically running contact plugs, certain alignment margins (i.e., tolerance for misalignment between a contact plug and a bit line) must be observed to ensure the reliability of the resulting semiconductor device. Such alignment margins are largely defined by the separation distance that exists between adjacent bit lines and/or contact plugs. Thus, decreasing pitches for bit lines and/or contact plugs will restrict alignment margins

SUMMARY OF THE INVENTION

In one embodiment the invention provides a semiconductor device comprising; a first interlayer insulating layer formed on a semiconductor substrate, wherein the first interlayer insulating layer comprises interleaved etched residual portions and non-etched portions, wherein each etched residual portion defines the geometry of a contact hole and a corresponding line-shaped trench connected to the contact hole in a contact region, and wherein each etched residual portion comprises a rounded shoulder portion defining the geometry of the contact region, a contact plug filling the contact hole and a corresponding wiring layer filling the line-shaped trench, wherein the contact plug electrically connects a conductive region of the semiconductor substrate with the wiring layer through the contact region.

In another embodiment, the invention provides a method of manufacturing a semiconductor device, comprising; forming a first etch-stop insulating layer on a semiconductor substrate, forming an interlayer insulating layer on the first etch-stop insulating layer, forming a composite hardmask pattern in a first direction on the interlayer insulating film, wherein the composite hardmask pattern comprises residual portions of a buffer insulating film, forming a crossing mask pattern in a second direction different from the first direction on the composite hardmask pattern, wherein the crossing mask pattern comprises an opening selectively exposing portions of the residual portions of the buffer insulating film, using the combination of the composite hardmask pattern and the crossing mask pattern, etching the exposed portions of the residual portions of the buffer insulating layer to form contact holes to a depth leaving a residual separation thickness between bottom surfaces of the contact holes and the first etch-stop insulating layer, removing the crossing mask pattern to expose residual etched portions of the interlayer insulating film, etching the exposed residual etched portions of the interlayer insulating layer to form a plurality of line-shaped trenches and simultaneously removing the residual separation thickness to form a plurality of contact holes selectively exposing portions of the first etch-stop insulating layer, filling the plurality of contact holes and the plurality of line-shaped trenches with at least one conductive material to simultaneously and integrally form a plurality of contact plugs in the plurality of contact holes, and a respectively connected plurality of wiring layers in the plurality of line-shaped trenches.

In another embodiment, the invention provides a method of manufacturing a semiconductor device, comprising; forming a first etch-stop insulating layer on a semiconductor substrate, forming a first interlayer insulating layer on the first etch-stop insulating layer, forming a second etch-stop insulating layer on the first interlayer insulating film, forming a second interlayer insulating layer on the second etch-stop insulating film, forming a composite hardmask pattern in a first direction on the second interlayer insulating film, wherein the composite hardmask pattern comprises residual portions of a buffer insulating film, forming a crossing mask pattern in a second direction different from the first direction on the composite hardmask pattern, wherein the crossing mask pattern comprises an opening selectively exposing portions of the residual portions of the buffer insulating film, using the combination of the composite hardmask pattern and the crossing mask pattern, etching the exposed portions of the residual portions of the buffer insulating layer to form contact holes though the second interlayer insulating layer and second etch-stop insulating layer to a depth leaving a residual separation thickness between bottom surfaces of the contact holes and the first etch-stop insulating layer, removing the crossing mask pattern to expose residual etched portions of the second interlayer insulating film, etching the exposed residual etched portions of the second interlayer insulating layer down to the second etch-stop insulating layer to form a plurality of line-shaped trenches and to simultaneously remove the residual separation thickness to form a plurality of contact holes selectively exposing portions of the first etch-stop insulating layer, filling the plurality of contact holes and the plurality of line-shaped trenches with at least one conductive material to simultaneously and integrally form a plurality of contact plugs in the plurality of contact holes, and a respectively connected plurality of wiring layers in the plurality of line-shaped trenches.

DETAILED DESCRIPTION OF THE INVENTION

The invention will now be described in relation to several exemplary embodiments with reference to the accompanying drawings. The invention may, however, be embodied in many different forms and should not be construed as being limited to only the illustrated embodiments. Rather, the embodiments are provided as teaching examples. Throughout the drawings, the thickness and relative thickness of various layers, regions and/or elements have been exaggerated for clarity. Throughout the written description and drawings like references are used to indicate like or similar elements.

Figure 1:
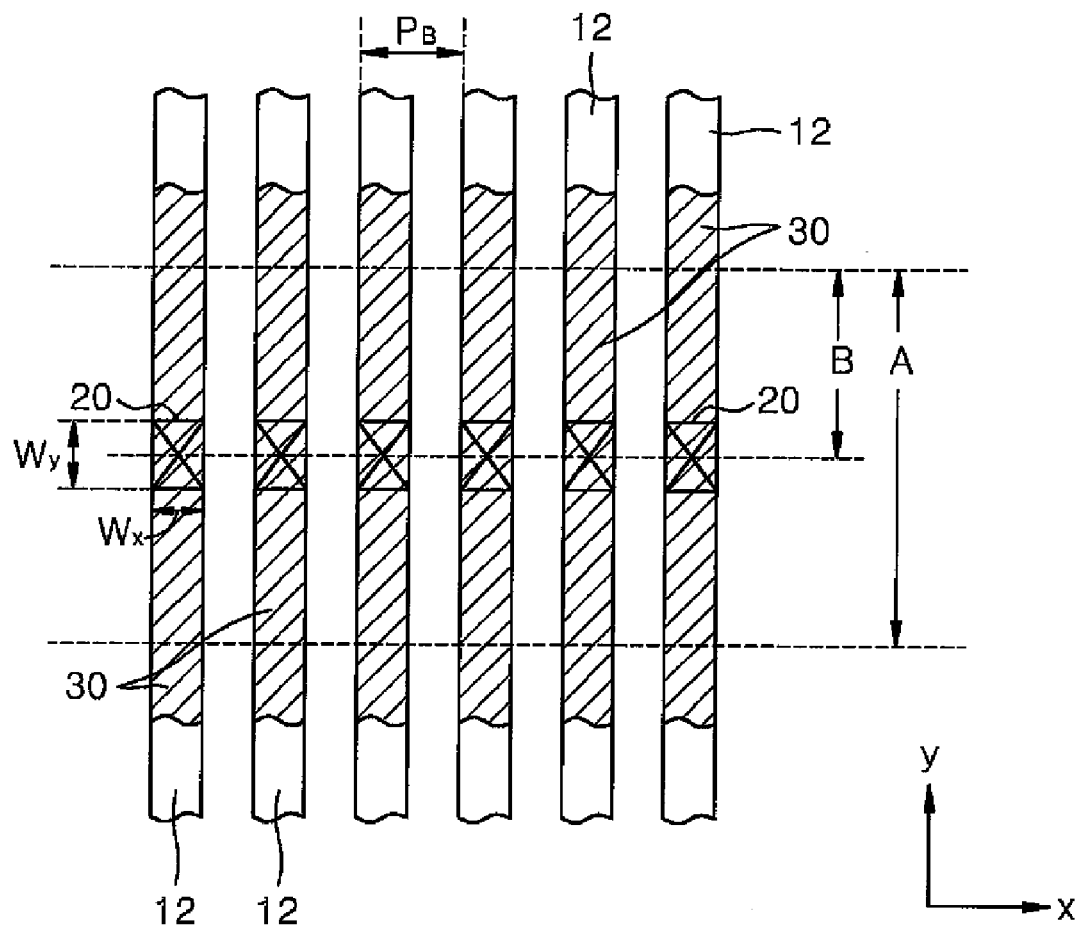
FIG. 1 is an overhead view illustrating an exemplary wiring layout for a semiconductor device according to an embodiment of the invention.

FIG. 1 is a general layout diagram illustrating an exemplary arrangement of wiring line patterns on a semiconductor substrate in accordance with an embodiment of the invention. The layout diagram of FIG. 1 has been taken from an example in which a plurality of bit lines 30 forms a portion of a flash memory device. This example selection is, however, merely exemplary and the invention, as taught by the following embodiments, may be applied to any number of different semiconductor devices and/or elements with same.

However, referring to the example illustrated in FIG. 1, each one of the plurality of bit lines 30 has a line width approximately equal to the width of a corresponding active region 12. For purposes of illustration, an arbitrary layout geometry has been assumed and certain "directions" within this geometry are noted to clearly describe the relative (and exemplary) orientation and arrangement of one element to another. Such descriptions are relative in nature.

For example, the plurality of active regions 12 and corresponding plurality of bit lines 30 are said to extend in parallel in a first direction (i.e., the "y" direction). In the illustrated example of FIG. 1, each one of the plurality bit lines 30 is electrically connected to a corresponding active region 12 by a direct contact 20. The plurality of bit lines 30 is formed with a desired bit line pitch "$P_B$." As a result, the plurality of direct contacts 20 is also formed with bit line pitch $P_B$. The plurality of direct contacts 20 is linearly arranged in a second direction (i.e., the "x" direction), where the first and second directions are at right angle to one another and define a principal lateral plane of the layout geometry.

FIGS. 2A through 2L are cutaway (or partial cutaway) perspective views sequentially illustrating a method of manufacturing a semiconductor device according to an embodiment of the invention. FIGS. 2A through 2L illustrate the integral formation of direct contacts 20 with bit lines 30 in accordance with the layout of FIG. 1. FIGS. 2A through 2F correspond to the region "A" identified in FIG. 1, and FIGS. 2G through 2L correspond to region "B" identified in FIG. 1.

Figure 2A:
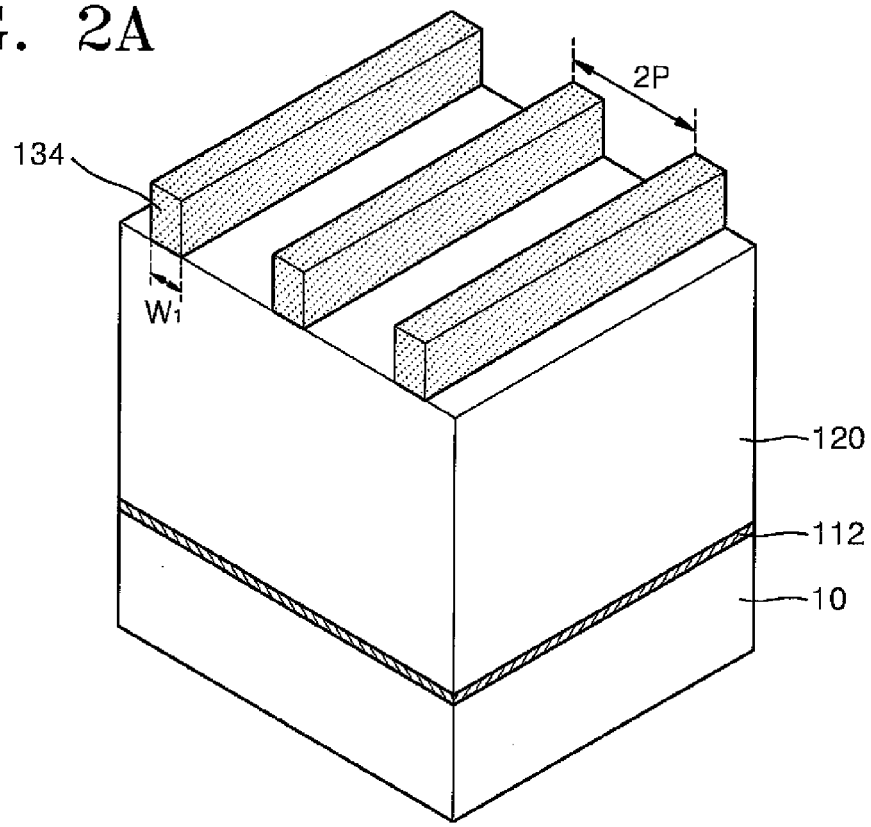
FIGS. 2A through 2L are cutaway perspective views illustrating a method of manufacturing the semiconductor device according to the embodiment of the invention.

Referring to FIG. 2A, a first etch-stop insulating layer 112 and a first interlayer insulating layer 120 are sequentially formed (e.g., vertically stacked in a third "z" direction, orthogonal to the lateral plane defined by the first and second directions) on a semiconductor substrate 10 in which active regions (not shown) are defined having a layout similar to the layout of the active regions 12 shown in FIG. 1.

Unit elements (not shown) required for forming the semi-conductor device including, e.g., a plurality of word lines, may be formed on semiconductor substrate 10. First interlayer insulating layer 120 may be formed by a plurality of insulating films covering the unit elements. Also, conductive regions (not shown) electrically connectable to the unit elements may be exposed on an upper surface of semiconductor substrate 10.

First etch-stop insulating layer 112 acts as an etch stop layer for etching processes applied to first interlayer insulating layer 120. First etch stop insulating layer 112 may be formed from one or more materials having an etch selectivity relative to first interlayer insulating layer 120. In certain embodiments, first interlayer insulating layer 120 and first etch stop insulating layer 112 may be respectively formed from a silicon nitride film, a silicon oxide film, a silicon oxide nitride film, and/or a silicon carbide layer in accordance with their desired etch selectivity characteristics. For example, if first etch stop insulating layer 112 is a nitride film, first interlayer insulating layer 120 may be an oxide film. In one embodiment, first etch stop insulating layer 112 is formed to a thickness of about 500 Å.

First interlayer insulating layer 120 may be formed from an insulating material having a relatively low dielectric constant so as to decrease a resistance capacitance (RC) delay caused by a coupling capacitor which may be produced due to the decrease in spacing width between adjacent bit lines. For example, first interlayer insulating layer 120 may be formed from of tetraethylorthosilicate (TEOS), fluorine silicate glass (FSG), SiOC, SiLK, etc. Alternately, first interlayer insulating layer 120 may be formed from one or more oxide film(s) selected from a group of possible films including thermally-formed oxide films, chemical vapor deposition (CVD)-formed oxide films, un-doped silicate glass (USG) films, and high density plasma (HDP) oxide films. Alternatively, first interlayer insulating layer 120 may be formed from one or more nitride films selected from a group of possible films including SiON, SiN, SiBN and BN. Alternately, first interlayer insulating layer 120 may be formed with a stacked structure including one or more nitride film(s) and one or more oxide film(s) such as those identified above.

A first plurality of mask patterns 134 is formed on first interlayer insulating layer 120 using conventional photolithography techniques. In the illustrated example, the first plurality of mask patterns 134 is formed with a first pitch 2P that is twice that of a desired "final" pitch P (see, e.g., composite hardmask pattern 130 in FIG. 2E). In the illustrated example, final pitch P for composite hardmask pattern 130 is the same as the desired bit line pitch $P_B$ for bit lines 30 of FIG. 1. For example, a first width $W_1$ defining each first mask pattern 134 may be designed to be ¼ of the first pitch 2P.

First mask patterns 134 may be formed from a material having an etch selectively relative to the material forming first interlayer insulating layer 120, (i.e., one or more material(s) having different etch rates relative to a particular etching process). For example, first mask patterns 134 may be formed from one or more materials such as an oxide film, a nitride film, a polysilicon film, and/or a metal film. For example, if first interlayer insulating layer 120 is an oxide layer or a nitride film, first mask patterns 134 may be a polysilicon film. Otherwise, if first interlayer insulating layer 120 is a nitride film, first mask patterns 134 may be an oxide film.

Figure 2B:
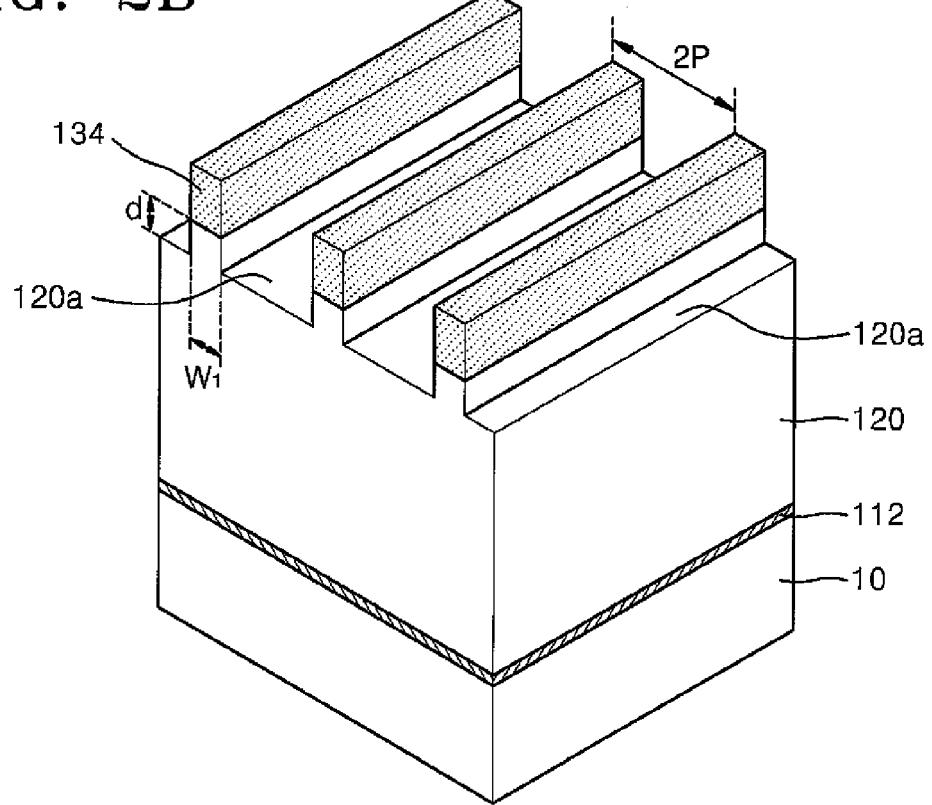

Referring to FIG. 2B, a first thickness "d" is removed from the upper surface of first interlayer insulating layer 120 exposed by first mask patterns 134, so that reduced surface portions 120a are formed in the upper surface of first interlayer insulating layer 120. In the illustrated embodiment, the first thickness "d" has a vertical depth equal to the first width $W_1$ for first mask patterns 134.

A conventional dry etching process may be used to form reduced surface portions 120a in the upper surface of first interlayer insulating layer 120. For example, the process used to form first mask patterns 134 may include an over-etching of first interlayer insulating layer 120 to form reduced surface portions 120a. Alternatively, a dry etching process may be separately applied to the upper surface of first interlayer layer 120 through first mask patterns 134 to form reduced surface portions 120a. However, the formation of reduced surface portions 120a is not essential to certain embodiments of the invention and may be omitted.

Figure 2C:
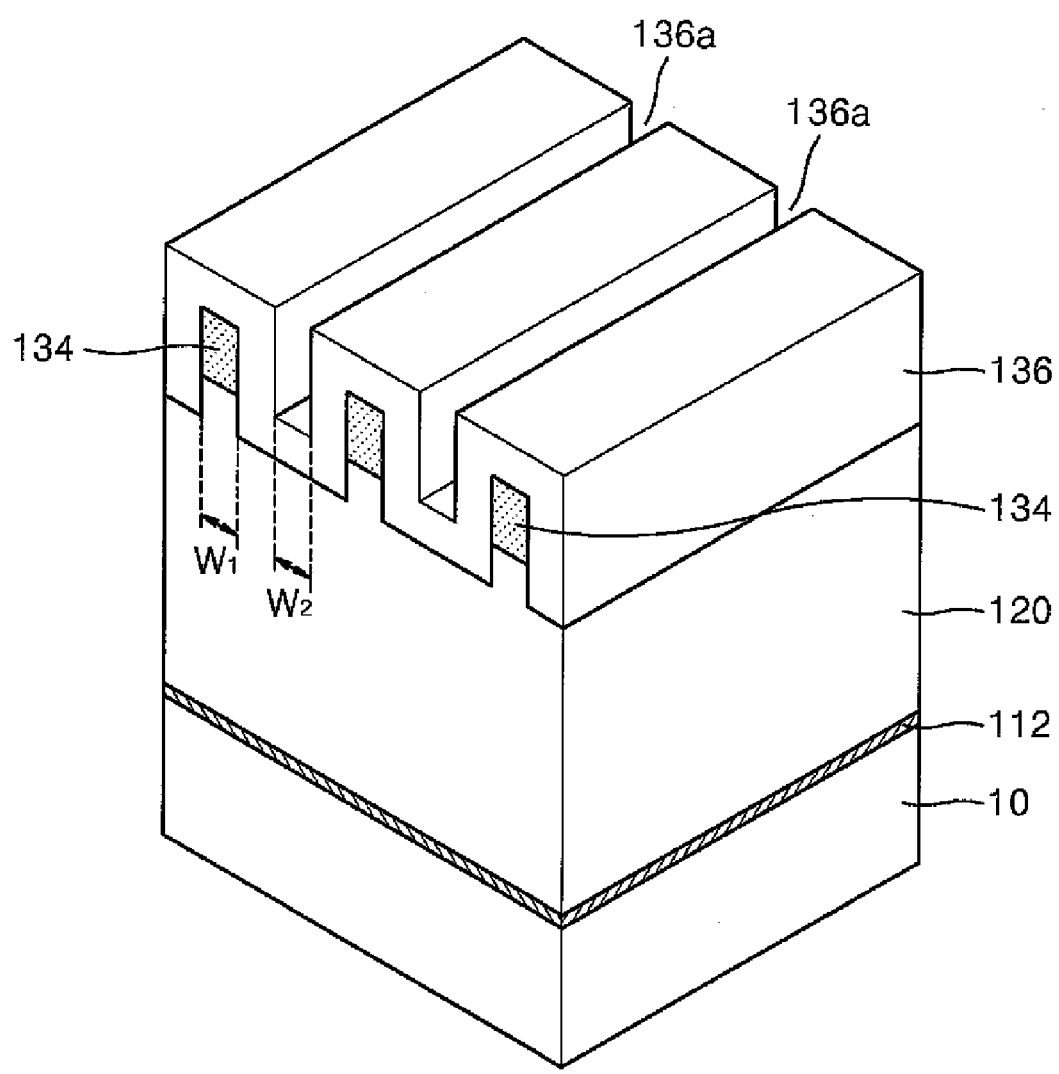

Referring to FIG. 2C, a buffer insulating layer 136 is formed on sidewalls of first mask patterns 134 to form recess regions 136a having a predetermined width between adjacent ones of first mask patterns 134. Thus, buffer insulating layer 136 may be formed to cover the upper and sidewall surfaces of first mask patterns 134 as well as reduced surface portions 120a of first interlayer insulating layer 120. In the illustrated example, buffer insulating layer 136 is formed to a thickness equal to first thickness "d". In this particular embodiment, the thickness of buffer insulating layer 136 defines recess regions 136a with a second width $W_2$ equal to first width $W_1$.

Buffer insulating layer 136 may be formed from one or more material(s) having etch characteristics the same as or similar to those of first interlayer insulating layer 120. For example, in one particular embodiment, buffer insulating layer 136 is formed from the same material as first interlayer insulating layer 120. Buffer insulating layer 136 may be an oxide film, for example, and may be formed using a conventional atomic layer deposition (ALD) process.

Figure 2D:
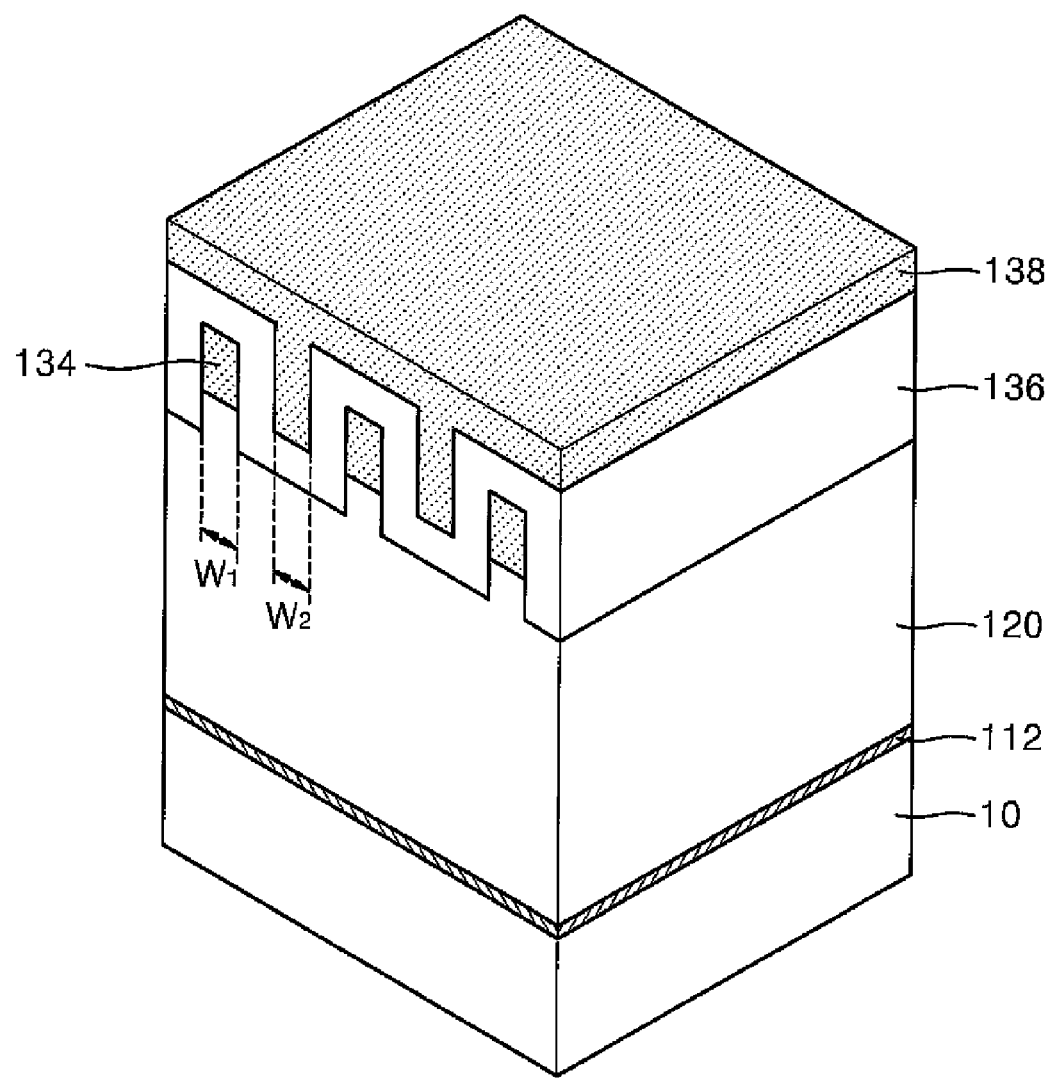

Referring to FIG. 2D, a second mask layer 138 is formed on buffer insulating layer 136. Second mask layer 138 may be formed from one or more material(s) having etch characteristics that are the same or similar to those of first mask patterns 134. For example, second mask layer 138 may be formed from one or more material(s), such as an oxide, nitride, polysilicon, and/or metal. For example, when first interlayer insulating layer 120 and buffer insulating layer 136 are formed from an oxide layer or a nitride film, second mask layer 138 may be formed from a polysilicon film. If first interlayer insulating layer 120 and buffer insulating layer 136 are each formed from an oxide film, second mask layer 138 may be formed from a polysilicon layer or a nitride film.

Upon forming second mask layer 138, recess regions 136a are filled with the material forming second mask layer 138. If a thickness of buffer insulating layer 136 is ¼ that of the first pitch 2P, the resulting width of the portion of second mask layer 138 filling recess region 136a will be the second width $W_2$ (e.g., in the illustrated example, ¼ of the first pitch 2P, or the first width $W_1$).

Figure 2E:
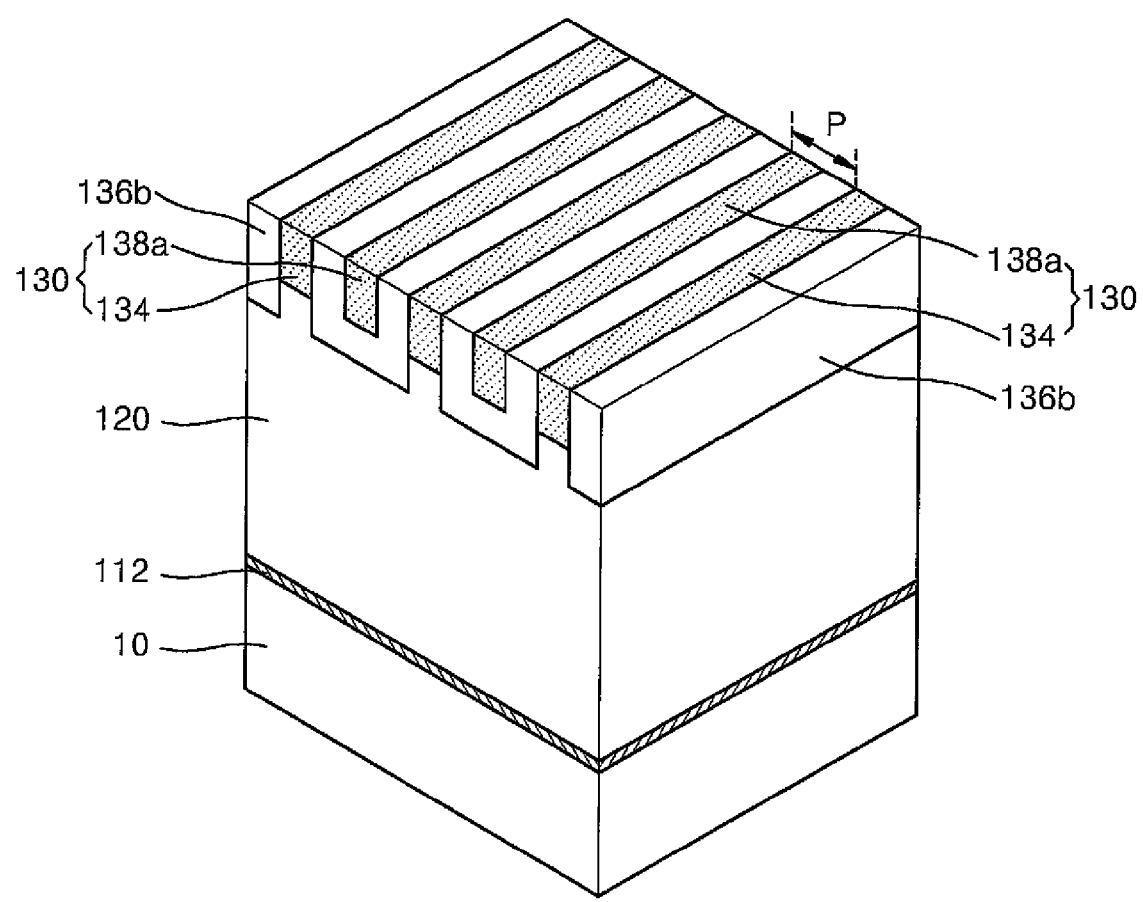

Referring to FIG. 2E, upper laterally extending portions of second mask layer 138 and buffer insulating layer 136 are removed to expose the upper surface of first mask patterns 134. In this manner, a second plurality of mask patterns 138a may be formed in recess regions 136a.

The second plurality of mask patterns 138a are interleaved in a self-aligned manner with the first plurality of mask patterns 134 and residual portions of buffer insulating layer 136b. These parallel interleaving line patterns extending laterally in the first direction on first interlayer insulating layer 120. The resulting combination of first mask patterns 134 and second mask patterns 138a form a composite hardmask pattern 130. Composite hardmask pattern 130 may now be used as an etch mask during a subsequently applied dry etching process to first interlayer insulating layer 120. Of particular note, composite hardmask patterns 130 have a line pattern that now repeats with a pattern width equal to the first width $W_1$ separated by a similar width equal to ¼ the first pitch 2P. As a result, hardmask patterns 130 may be formed with a final pitch P that is ½ the first pitch 2P, where the first pitch 2P may represent the finest pitch obtainable by the resolution limits of the photolithography equipment being used.

In the foregoing, a conventionally applied chemical mechanical polishing (CMP) process may be used to simultaneously remove the upper laterally extending portions of second mask layer 138 and buffer insulating layer 136. Alternately, the upper laterally extending portions of second mask layer 138 and buffer insulating layer 136 may be separately removed by the application of separate conventional etching processes in order to form the resultant structure illustrated in FIG. 2E. For example, respective timed wet etching processes may be separately used to remove the upper laterally extending portions of second mask layer 138 and buffer insulating layer 136.

Figure 2F:
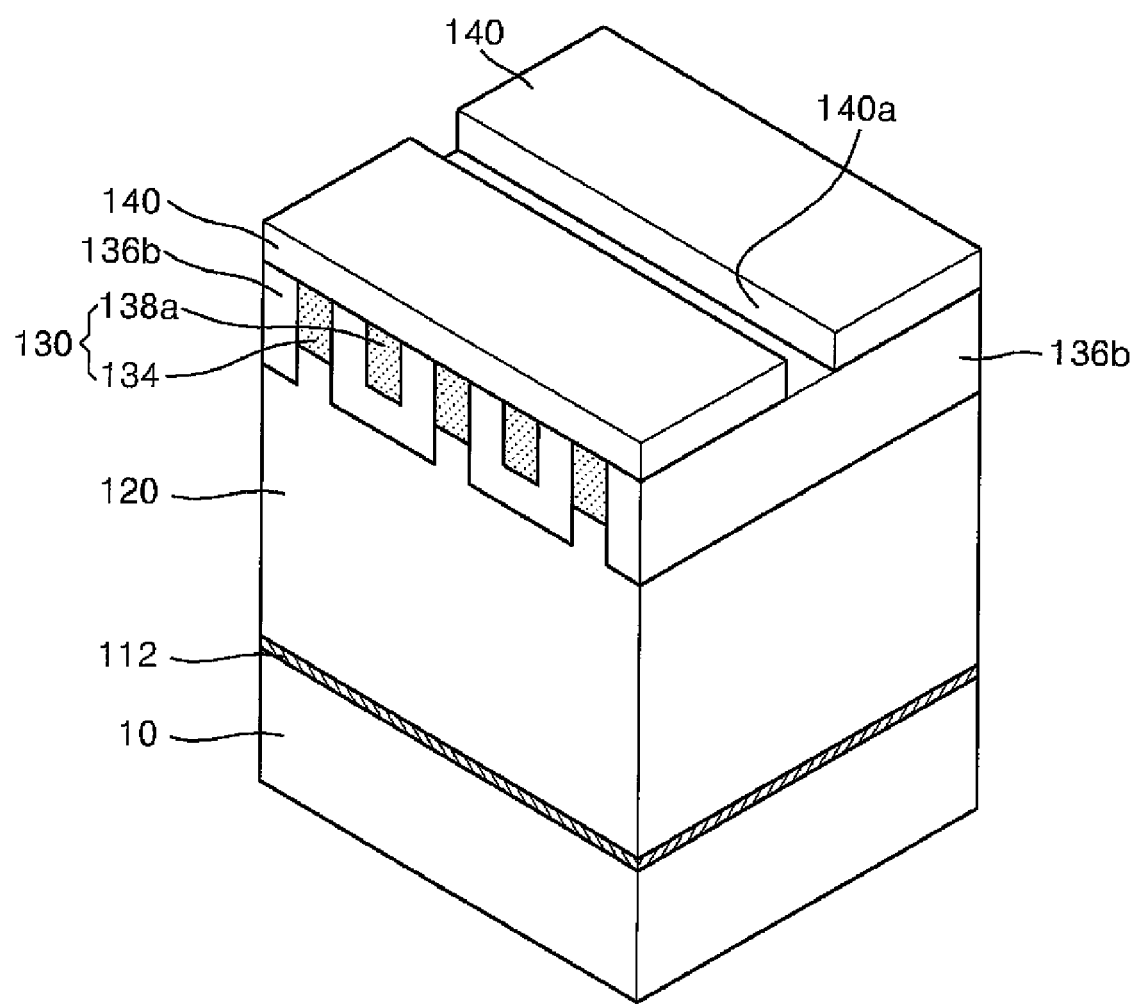

Referring to FIG. 2F, a crossing mask pattern 140 having an opening 140a selectively exposing the upper surface of the residual portions of the buffer insulating layer 136a and composite hardmask pattern 130 is formed on the resultant structure. The line shaped opening 140a formed in crossing mask pattern 140 extends in the second direction orthogonal to composite hardmask pattern 130. The position and width of line-shaped opening 140a defines the lateral geometry of direct contacts 20 shown in FIG. 1. In the illustrated example, opening 140a has a simple linear shape, but embodiments of the invention are not limited thereto, and direct contacts 20 having a more complex lateral geometry may be formed. Similarly, crossing mask pattern 140 need not be orthogonal to composite hardmask pattern 130, but may have a geometric orientation that practically ranges from, for example 5 to 90°.

Alternately, the linear (or line-shaped) crossing mask pattern 140 may be replaced with a crossing mask pattern 140 formed by a plurality of island-shaped openings. This type of crossing mask pattern 140 may be particularly useful where the ultimate layout of direct contacts is non-linear (or arbitrary) in nature.

The resulting overlay arrangement between composite hardmask pattern 130 and crossing mask pattern 140 selectively exposes the upper surface of the residual portions of the buffer insulating layer 136b. These exposed portions of the residual portions of the buffer insulating layer 136b correspond to the desired locations of direct contact holes 20. That is, the exposed residual portions of the buffer insulating layer 136b will be vertically etched to form contact holes through first interlayer insulating layer 120.

In one embodiment, crossing mask pattern 140 is formed from a photoresist film, but may alternately or additionally be formed by singularly applied or stacked multiple films including a polysilicon film, a nitride film, an amorphous carbon layer (ACL), a capping layer such as SiON, TEOS, and ALD-oxide, an anti-reflective coating (ARC) film, etc. For example, crossing mask pattern 140 may be formed by sequentially stacking a spin on carbon (SOC) film, a silicon ARC layer and a photoresist layer, or by sequentially stacking an SOC film, a silicon ARC film, an organic ARC layer and a photoresist layer.

Figure 2G:
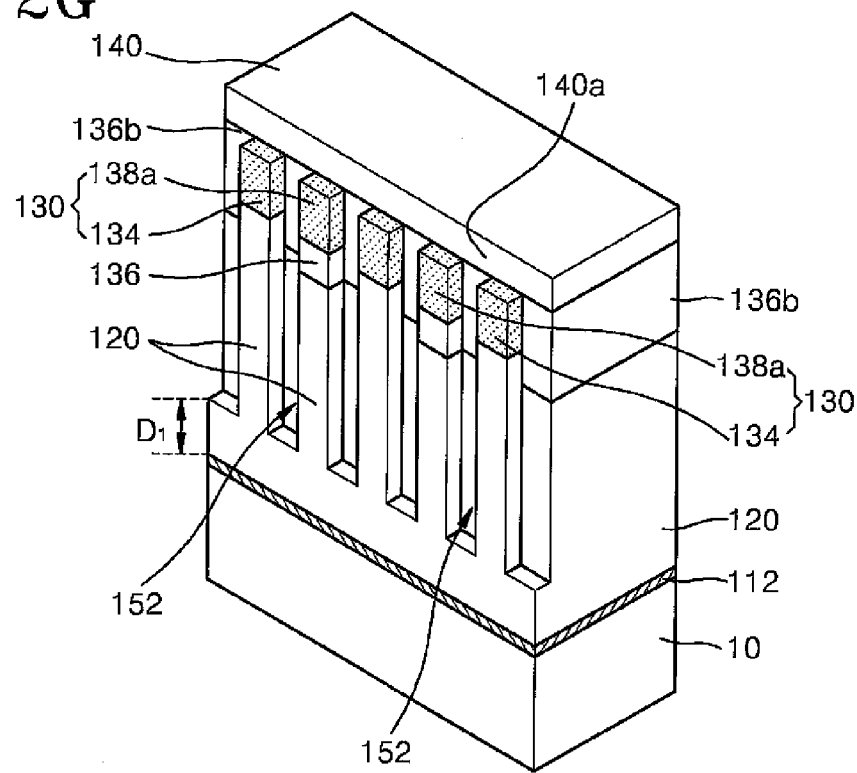

Referring to FIG. 2G, using composite hardmask pattern 130 and crossing mask pattern 140 as an etch mask, the residual portions of the buffer insulating layer 136b and first interlayer insulating layer 120 may be anisotropically dry etched to form upper contact holes 152. In the illustrated embodiment, upper contact holes 152 are formed by partially etching down through first interlayer insulating layer 120 leaving a separation thickness $D_1$ between the bottom of the upper contact holes 152 and the first etch-stop insulating layer 112. In certain embodiments of the invention, the separation thickness $D_1$ remaining from first interlayer insulating layer 120 under upper contact holes 152 will correspond in its thickness to a desired thickness for subsequently formed wiring layers.

Figure 2H:
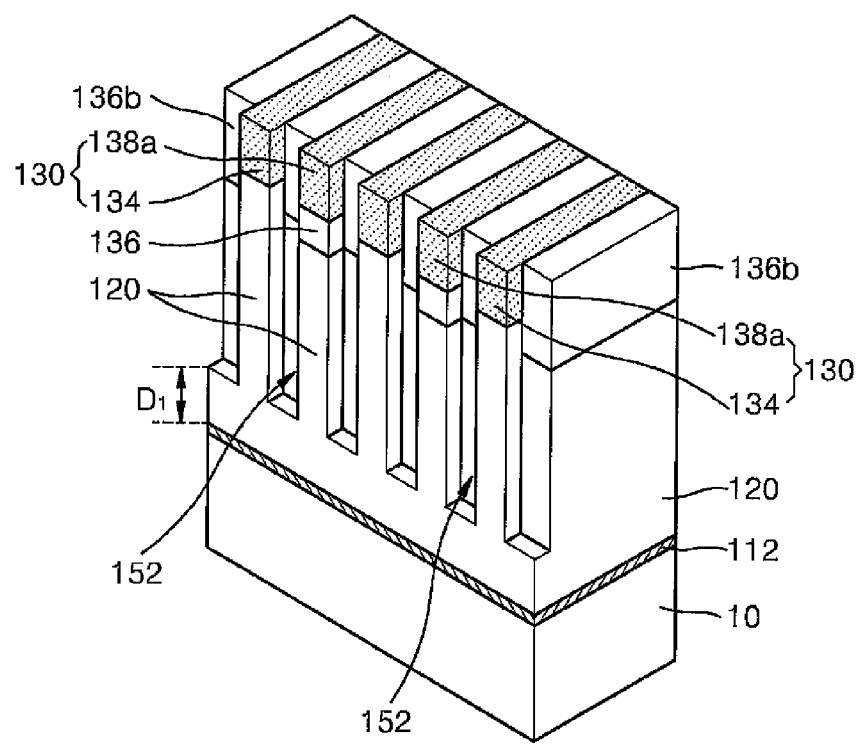

Referring to FIG. 2H, crossing mask patterns 140 are removed.

Figure 2I:
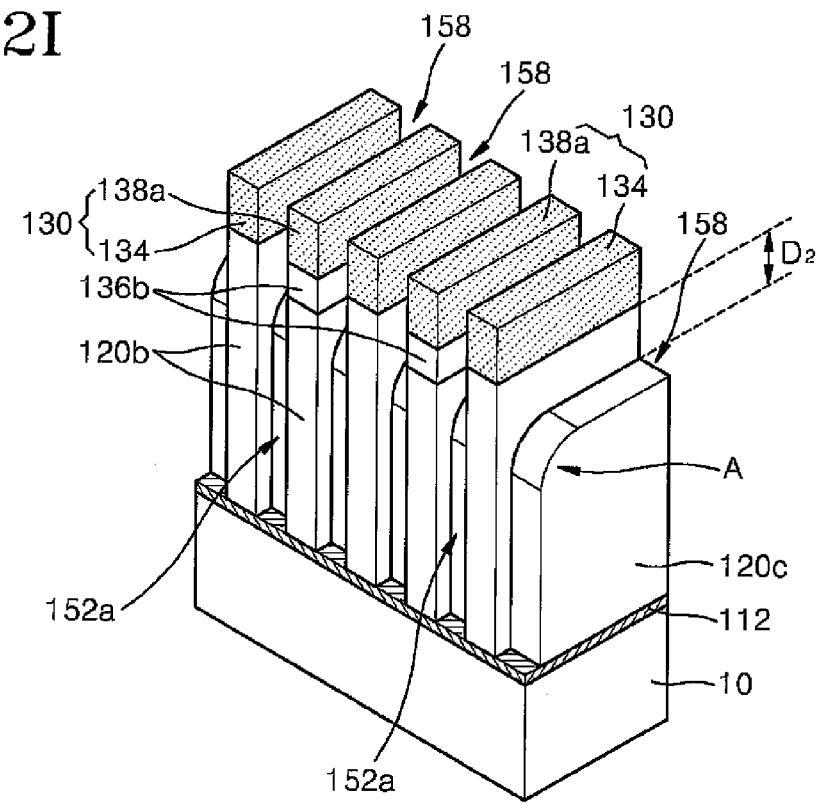

Referring to FIG. 2I, using composite hardmask pattern 130 as an etch mask, the exposed residual portions of the buffer insulating layer 136b and underlying portions of first interlayer insulating layer 120 are further etched to form a plurality of line-shaped trenches 158 extending in parallel with composite hardmask pattern 130. Each one of the line-shaped trenches 158 is connected to a corresponding one of the upper contact holes 152. During formation of the line-shaped trenches 158, an upper corner "A" of first interlayer insulating layer 120 near the connection point of each line-shaped trench 158 and upper contact hole 152 is etched to have a rounded profile. Thus, etched-residual portions of first interlayer insulating layer 120c include a rounded shoulder portion "A". In the illustrated embodiment, the etched-residual portions of first interlayer insulating layer 120c are inter-leaved with non-etched portions of first interlayer insulating layer 120b.

As the plurality of line-shaped trenches 158 is formed, the residual separation thickness $D_1$ of the first interlayer insulating layer 120 exposed through upper contact holes 152 is entirely etched away, such that upper contact holes 152 exposes first etch stop insulating layer 112.

In the illustrated embodiment, a formation depth $D_2$ for the line-shaped trenches 158 into the upper surface of first interlayer insulating layer 120 is made equal to the residual separation thickness $D_1$ of first interlayer insulating layer 120. However, the subject invention is not restricted to embodiments containing this particular feature, and the formation depth $D_2$ for the line-shaped trenches 158 may be greater or less than the residual separation thickness $D_1$ for the first interlayer insulating layer 120.

Figure 2J:
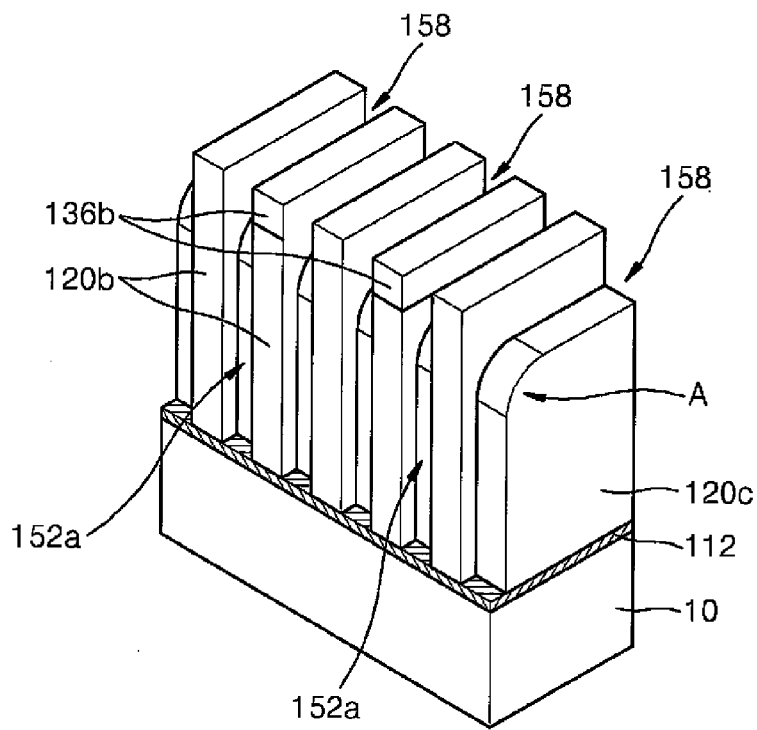

Referring to FIG. 2J, composite hardmask pattern 130 is removed. This may be accomplished by application of a conventional wet etching process.

Figure 2K:
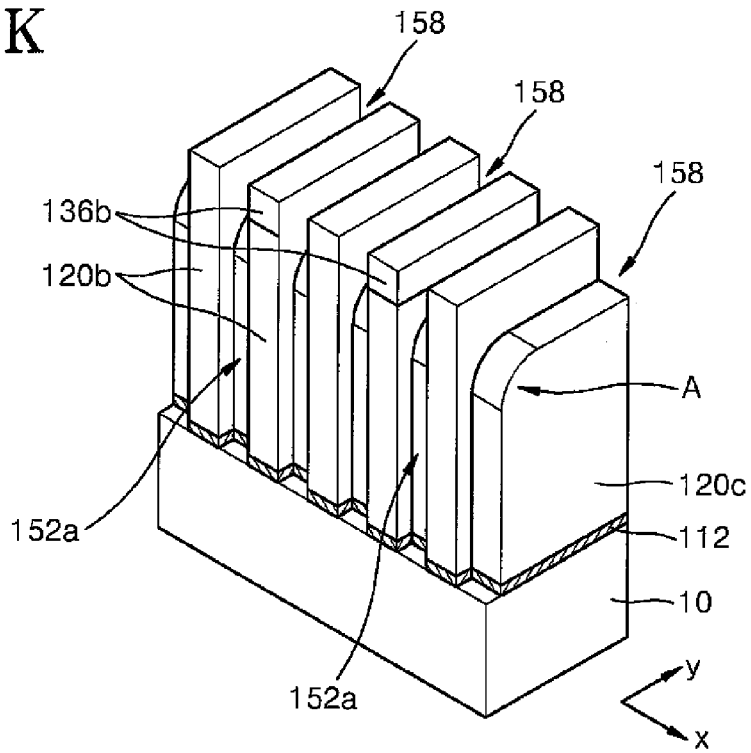

Referring to FIG. 2K, using non-etched portions of the first interlayer insulating layer 120b and the residual portions of the buffer insulating layer 136b as an etch mask, portions of the first etch stop insulating layer 112 exposed by contact holes 152a are anisotropically dry etched to expose conductive regions of semiconductor substrate 10. For example, during the manufacture of a semiconductor device having the layout shown in FIG. 1, active regions 12 may be exposed through contact holes 152a in the manner described above.

Thus, as shown in FIG. 2K, a plurality of contact holes 152a is formed to selectively expose conductive regions of semiconductor substrate 10 through first interlayer insulating layer 120. The width of each contact hole 152a—as measured in the first (or "y") direction (i.e., the direction parallel to the lateral running direction of composite hardmask pattern 130)—is defined in part by the geometry of the rounded shoulder portion "A" of each etched residual portion of the first interlayer insulating layer 120c, as this feature defines the location of the etched sidewall of etched residual portion of the first interlayer insulating layer 120c. Thus, the y-direction width of each contact hole 152a will vary in accordance with the sidewall location of this feature on semiconductor substrate 10. Furthermore, in the illustrated example, the width of each contact hole 152a—as measured in the second direction (or "x") at right angles to the first direction—is defined by the separation distance between adjacent non-etched portions of the first interlayer insulating layer 120b.

Figure 2L:
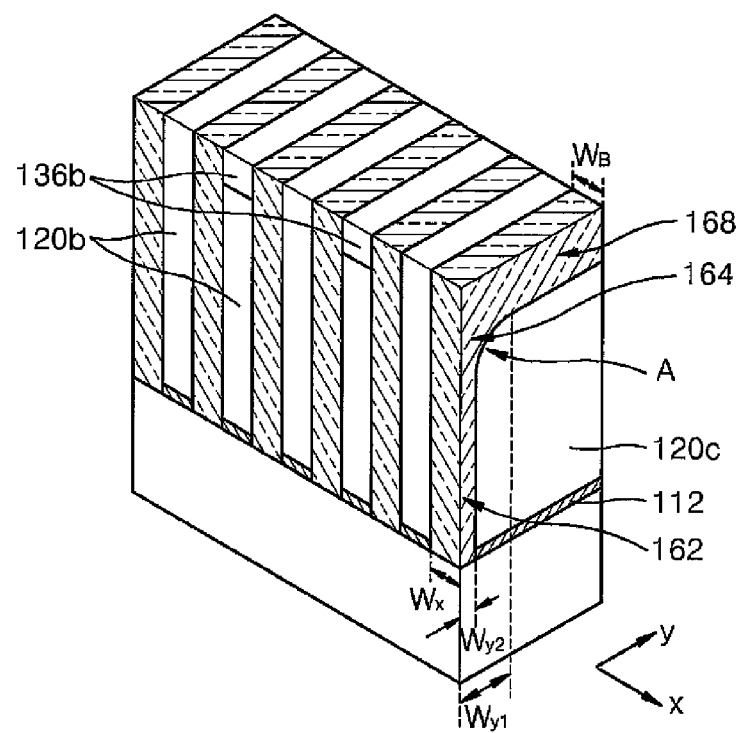

Referring to FIG. 2L, the plurality of contact holes 152a and the corresponding plurality of line-shaped trenches 158 are filled with one or more conductive material(s) to form contact plugs 162 filling contact holes 152a and wiring layers 168 filing the line-shaped trenches 158. In order to properly form wiring layers 168 having a defined thickness in one embodiment of the invention, a conventional CMP or etch-back process is applied to the upper surface of the conductive material using the upper surface of interlayer insulating layer 120 and/or the residual portions of the buffer insulating layer 136b as an etch stop.

The conductive material used to form contact plugs 162 and wiring layers 168 may include one or more of metals such as W, Cu, Ti or Ta, metal nitrides such as WN, TiN and TaN, and/or doped polysilicon.

Since each rounded shoulder portion "A" of each etched residual portion of the first interlayer insulating layer 120c is located at the juncture of a contact hole 152a and corresponding line-shaped trench 158, the material width of each contact plug 162 will be defined in part by the geometry of the rounded shoulder portion "A" where contact plug 162 and wiring layer 168 are integrally connected in a contact region 164. Thus, the upper section of each contact plug 162 widens beyond its middle section or lower section geometry in the contact region 164.

The illustrated embodiment of FIG. 2L will be described in some additional detail. Each contact plug has an x-direction width of $W_x$ defined by the separation distance between non-etched portions of the first interlayer insulating layer 120b. In the working example, this x-direction width is equal to ¼ the first pitch or W1. (See, FIGS. 2A and 2B). The lower and middle sections of contact plug 162 have a y-direction width of $W_{y2}$. Contact region 164 has a y-direction width $W_{y1}$ that varies in relation to the geometry of rounded shoulder portion "A" of each etched residual portion of the first interlayer insulating layer 120c. The width $W_B$ of each wiring layer 168 is approximately equal to Wx of contact plug 162 in the x-direction.

Of further note, contact region 164 has a cross-sectional characterized by the absence of a sharp point connecting contact plug 162 and a corresponding wiring layer 168. This broadened and rounded contact surface between contact plug 162 and wiring layer 168 provides improve electrical characteristics.

Contact plug 162 and wiring layer 168 in the foregoing embodiments combine to form direct contact 20 and bit line 30 of FIG. 1. That is, direct contact 20 and bit line 30 are connected in contact region 164 having the characteristics noted above. As a result, contact resistance between direct contact 20 and bit line 30 is decreased and overall electrical performance improved.

Figure 3A:
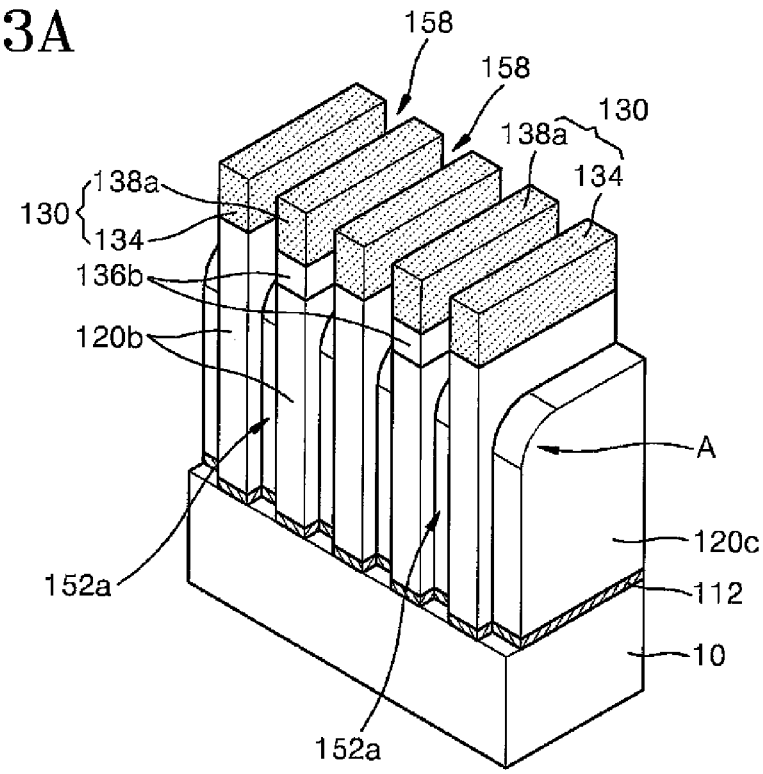
FIGS. 3A and 3B are cutaway perspective views illustrating a method of manufacturing a semiconductor device according to another embodiment of the invention.
Figure 3B:
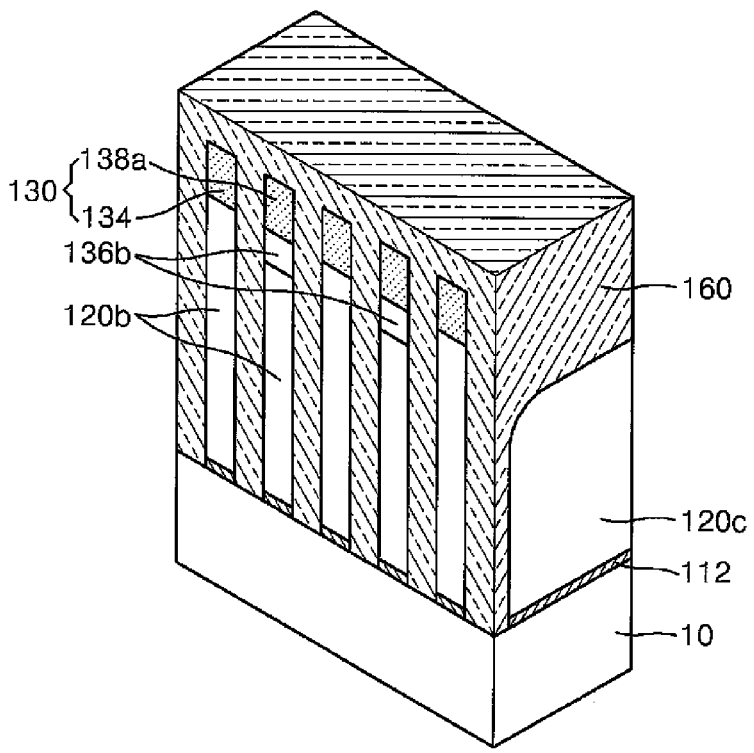

FIGS. 3A and 3B are cutaway perspectives illustrating a method of manufacturing a semiconductor device according to another embodiment of the invention. FIGS. 3A and 3B illustrate another integral formation of a direct contact with a bit line consistent with the layout shown in FIG. 1. FIGS. 3A and 3B correspond to the region "B" of FIG. 1.

The illustrated method of manufacturing a semiconductor device is quite similar to that previously described with reference to FIGS. 2A through 2L. However, in the embodiment of FIGS. 3A and 3B when removing portions of the first etch stop insulating layer 112 in order to expose conductive regions of semiconductor substrate 10, composite mask pattern 130 is allowed to remain on first interlayer insulating layer 120. In FIGS. 3A and 3B, reference numerals common to FIGS. 2A through 2L denote equivalent elements. Therefore, detailed description on like parts will not be repeated.

Referring to FIG. 3A, after forming of contact holes 152a that expose selected portions of first etch stop insulating layer 112 and after forming line-shaped trenches 158 respectively connecting contact holes 152, composite mask patterns 130, first interlayer insulating layer 120, and the residual portions of the buffer insulating layer 136b are used as an etch mask to remove the exposed portions of first etch stop insulating layer 112. Thus, conductive regions (not shown) of semiconductor substrate 10 are exposed by contact holes 152a.

Referring to FIG. 3B, a conductive material is then deposited on composite mask pattern 130 and on interlayer insulating layer 120 to form a conductive layer 160 filling contact holes 152a and line-shaped trenches 158. The detailed description of the conductive material is the same as described with reference to FIG. 2L.

Then, a portion of conductive layer 160 and composite mask pattern 130 may be removed until the upper surface of interlayer insulating layer 120 and/or the residual portions of the buffer insulating layer 136 are exposed using a conventional CMP or etch-back process.

Figure 4A:
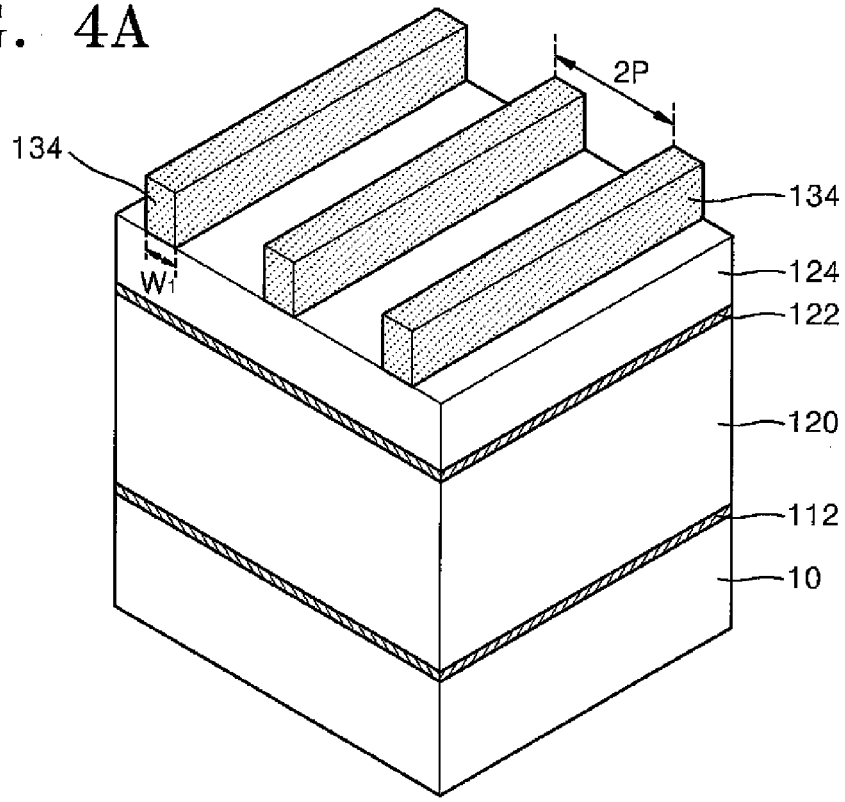
FIGS. 4A through 4E are cutaway perspective views illustrating a method of manufacturing a semiconductor device according to another embodiment of the invention.
Figure 4B:
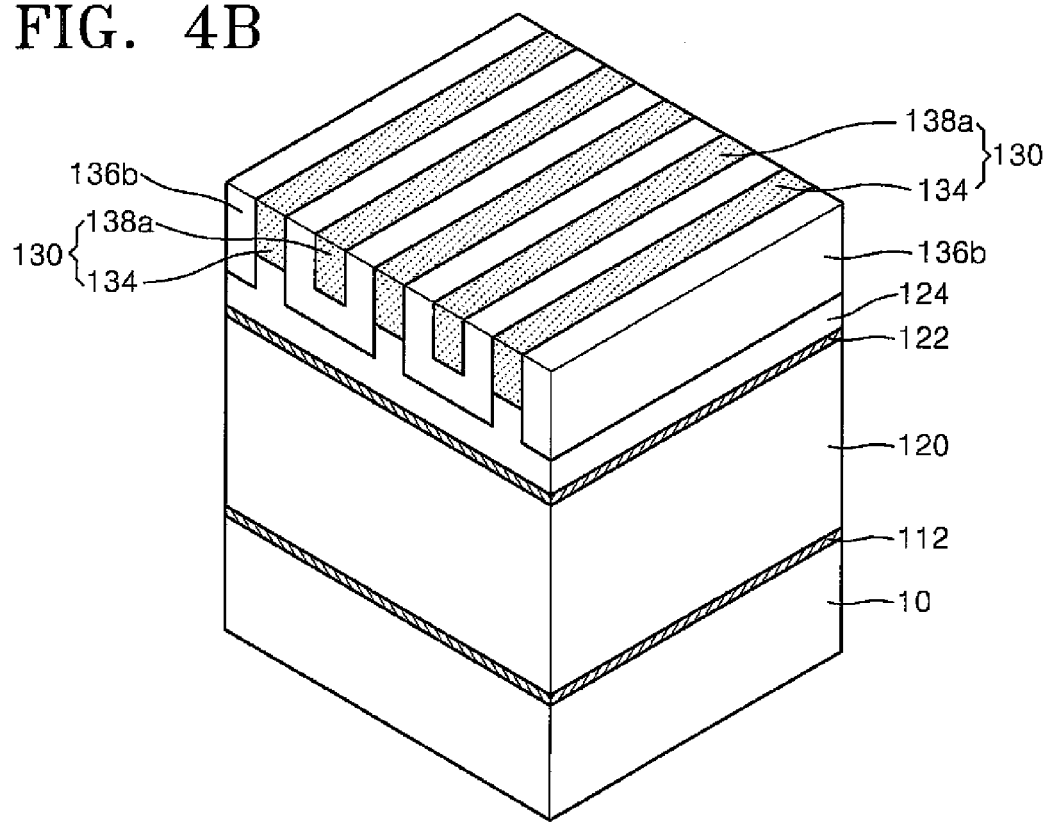

FIGS. 4A through 4E are cutaway perspective views illustrating a method of manufacturing a semiconductor device according to another embodiment of the invention. As above, FIGS. 4A through 4E illustrate the integral formation of direct contacts with associated bit lines consistent with the layout of FIG. 1. FIGS. 4A and 4B correspond to the region A of FIG. 1, and FIGS. 4C through 4E correspond to the region B of FIG. 1.

Figure 4C:
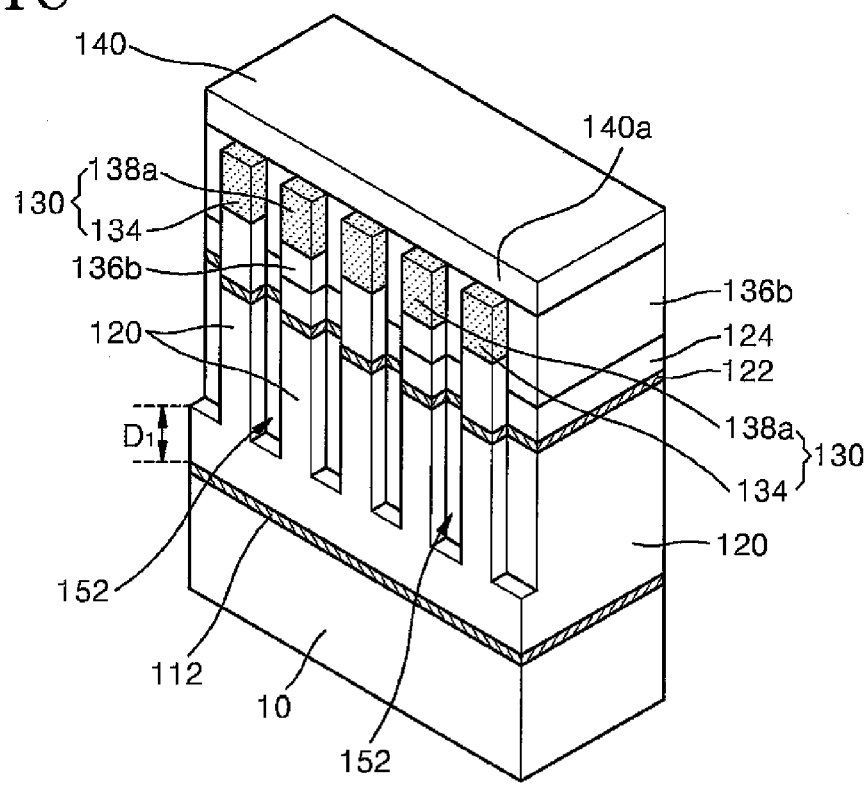
Figure 4D:
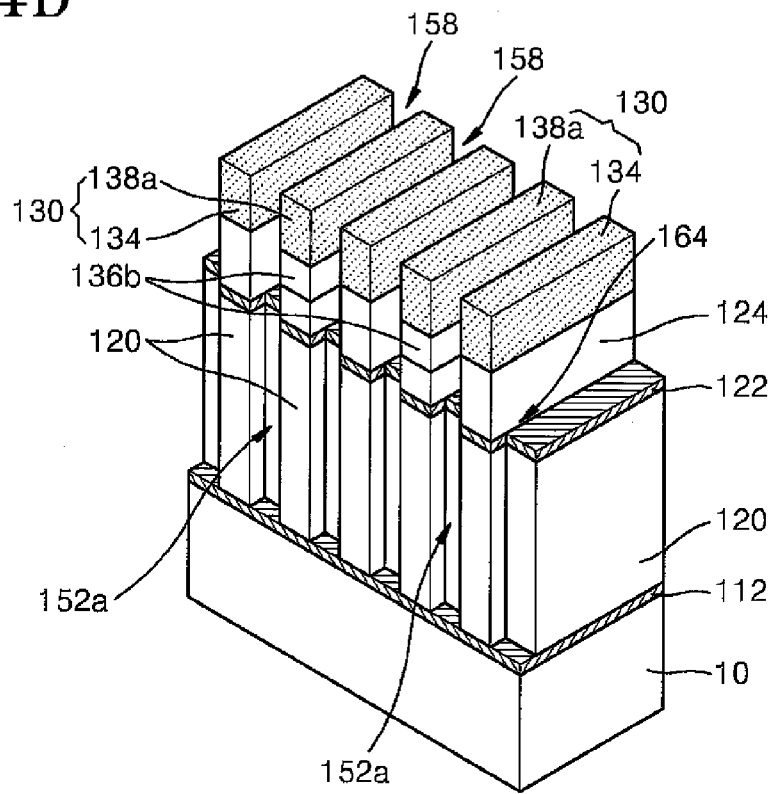
Figure 4E:
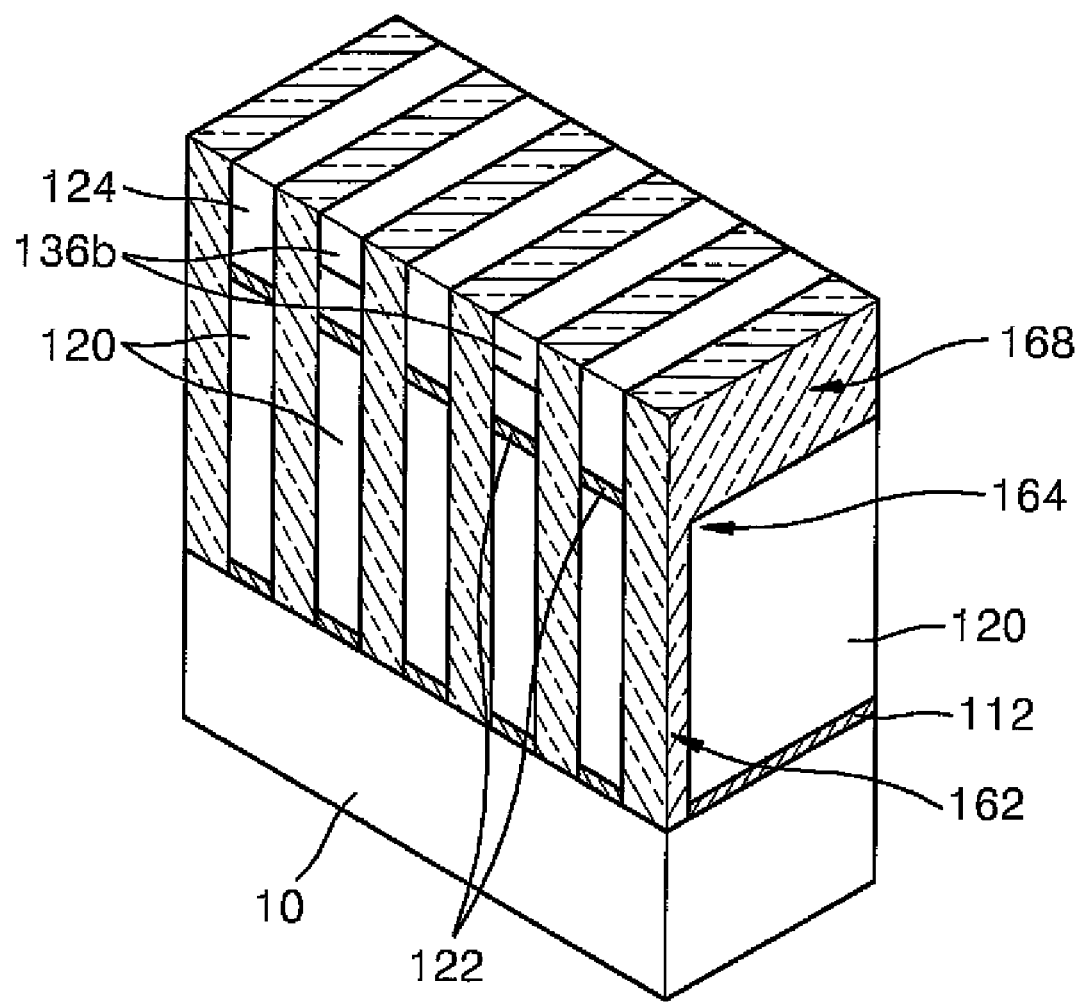

The method of manufacturing the semiconductor device illustrated in FIGS. 4A through 4E is similar to the method of manufacturing described in relation to FIGS. 2A through 2L. However, in the current embodiment, when forming the line-shaped trenches 158, a second etch stop insulating layer 122 is used as an etch stop layer. In FIGS. 4A and 4E, reference numerals common to FIGS. 2A through 2L denote equivalent elements. Therefore, a detailed description of like parts will not be repeated.

Referring to FIG. 4A, a first etch stop insulating layer 112, a first interlayer insulating layer 120, a second etch stop insulating layer 122, and a second interlayer insulating layer 124 are sequentially formed on a semiconductor substrate 10.

First etch stop insulating layer 112 acts as an etch stop layer when etching first interlayer insulating layer 120, and second etch stop insulating layer 122 acts as an etch stop layer when etching second interlayer insulating layer 124. First etch stop insulating layer 112 and second etch stop insulating layer 122 may be composed of a material that provides an etch selectivity in relation to first interlayer insulating layer 120 and second interlayer insulating layer 124, respectively. According to the constituent materials forming first interlayer insulating layer 120 and second interlayer insulating layer 124, first etch stop insulating layer 112 and second etch stop insulating layer 122 may be formed from (e.g.,) a silicon nitride film, a silicon oxide film, a silicon oxide nitride film, or a silicon carbide film. First etch stop insulating layer 112 and second etch stop insulating layer 122 may be composed of the same material or different materials. In one embodiment, first etch stop insulating layer 112 and second etch stop insulating layer 122 are each formed to a thickness of about 500 Å.

The material forming first interlayer insulating layer 120 and second interlayer insulating layer 124 may be the same as those described with reference to the first interlayer insulating layer 120 of FIG. 2A. First interlayer insulating layer 120 and second interlayer insulating layer 124 may be composed of the same material or materials different from each other.

A plurality of first mask patterns 134 are formed on second interlayer insulating layer 124 consistent with the description given in relation to FIG. 2A.

Referring to FIG. 4B, a buffer insulating layer 136 and a plurality of second mask patterns 138a are formed on the first mask patterns 134 according to the method as described with reference to FIGS. 2B through 2E. Thus, composite mask pattern 130 may be formed from first mask patterns 134 and second mask patterns 138a.

Referring to FIG. 4C, according to the method as described with reference to FIG. 2F, a crossing mask pattern 140 having an opening 140a partially exposing the upper surfaces of residual portions of buffer insulating layer 136 and composite hardmask pattern 130 is formed on a resultant structure.

Thereafter, using composite hardmask patterns 130 and crossing mask pattern 140 as an etch mask, the residual portions of buffer insulating layer 136b, second interlayer insulating layer 124, second etch stop insulating layer 122, and first interlayer insulating layer 120 may be sequentially dry etched using an anisotropic process. In this manner, upper contact holes 152 may be formed. At this time, as described with reference to FIG. 2G, upper contact holes 152 are formed only partially through the total thickness of first interlayer insulating layer 120, leaving a predetermined separation thickness $D_1$ in first interlayer insulating layer 120 to remain on first etch stop insulating layer 112.

Referring to FIG. 4D, after removing the crossing mask pattern 140 according to the method as described with reference to FIG. 2I, selected ones of the residual portions of the buffer insulating layer 136b and underlying portions of the second interlayer insulating layer 124 are etched using composite hardmask pattern 130 as an etch mask to form a plurality of line-shaped trenches 158 extending in parallel with composite hardmask pattern 130. In the illustrated embodiment, however, second etch stop insulating layer 122 is used as an etch stop layer when etching the second interlayer insulating layer 124 during formation of the line-shaped trenches 158.

Each line-shaped trench 158 is respectively connected to an upper contact hole 152 in a contact region. As before, during formation of the line-shaped trenches 158, the residual separation thickness $D_1$ of first interlayer insulating layer 120 is removed to selectively expose portions of first etch stop insulating layer 112.

Referring to FIG. 4E, as described with reference to FIGS. 2J through 2L or FIGS. 3A and 3B, the exposed portions of first etch stop insulating layer 112 are removed. Then, contact holes 152a and line-shaped trenches 158 are filled with one or more conductive material(s) to integrally form contact plugs 162 and wiring layers 168.

When first etch stop insulating layer 112 and second etch stop insulating layer 122 are formed from the same material (s) having similar etch characteristics, portions of second etch stop insulating layer 122 exposed by line-shaped trenches 158 are also removed while first etch stop insulating layer 112 exposed by contact holes 152a are removed. Thus, etched portions of first interlayer insulating layer 120c may be exposed by line-shaped trenches 158. At this time, as illustrated in FIG. 4E, the bottom surfaces of wiring layers 168 directly contact an upper surface of the etched portions of the first interlayer insulating layer 120c. However, the present invention is not restricted to this particular feature. Even though not illustrated, second etch stop insulating layer 122 may remain on first interlayer insulating layer 120 at the bottom of line-shaped trenches 158. In this case, second etch stop insulating layer 122 is interposed between first interlayer insulating layer 120 and wiring layers 168.

Figure 5A:
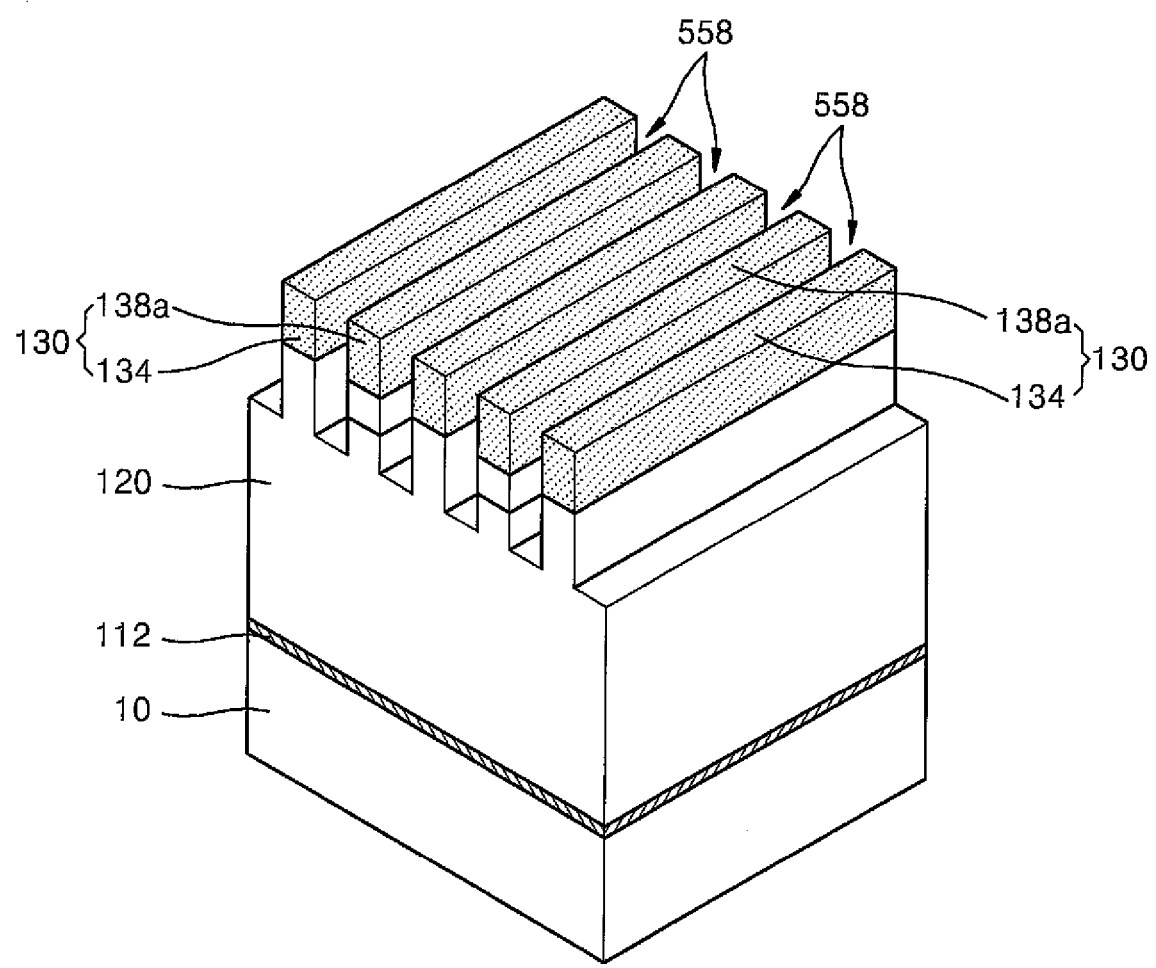
FIGS. 5A through 5E are cutaway perspective views illustrating a method of manufacturing a semiconductor device according to another embodiment of the invention.
Figure 5B:
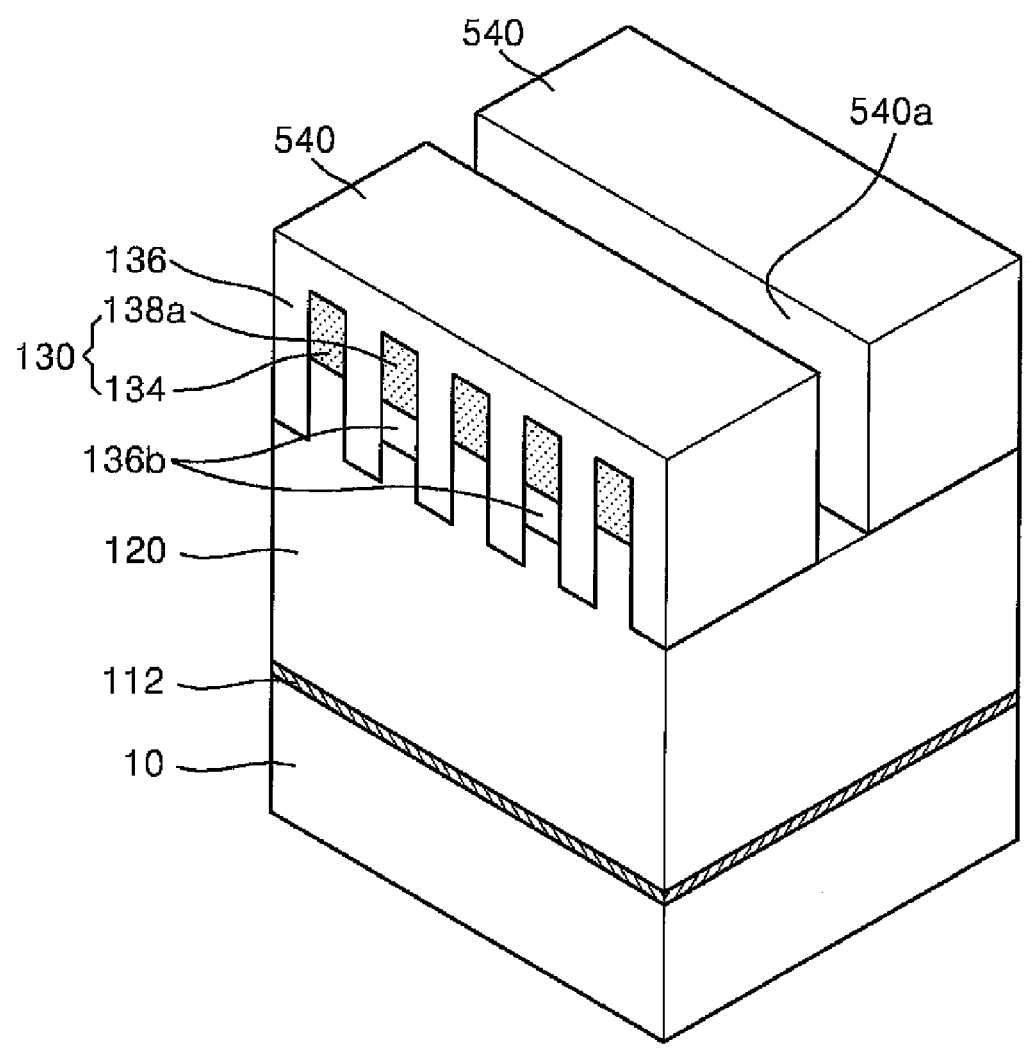
Figure 5C:
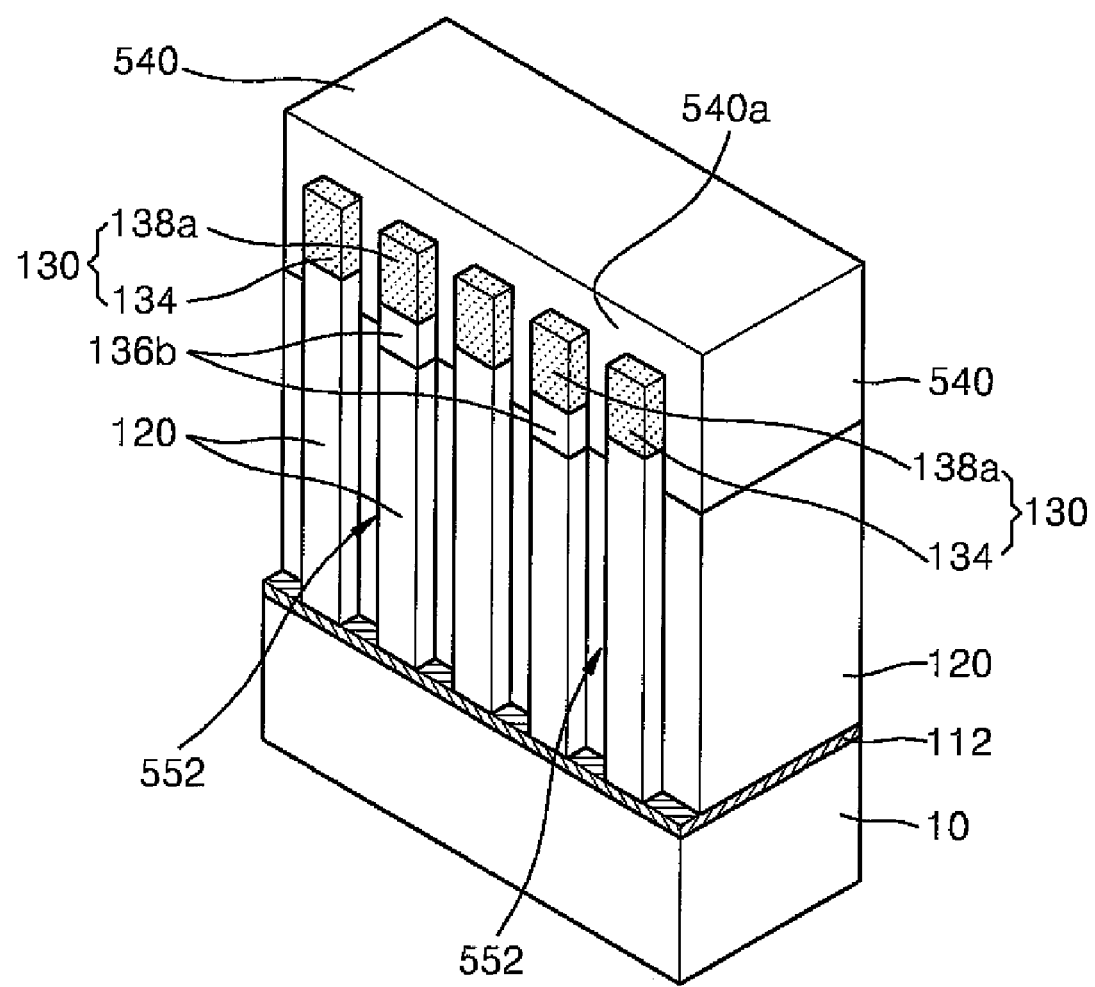
Figure 5D:
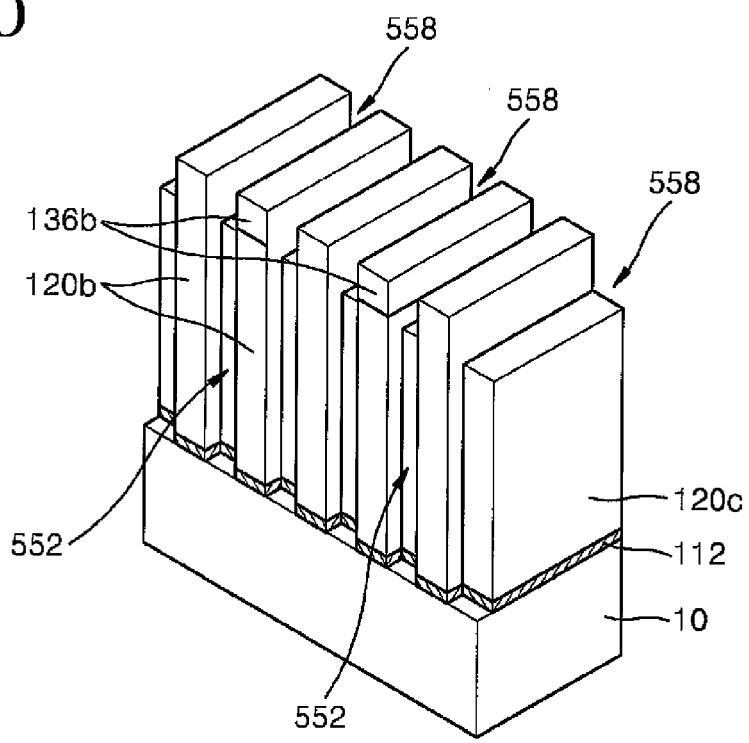
Figure 5E:
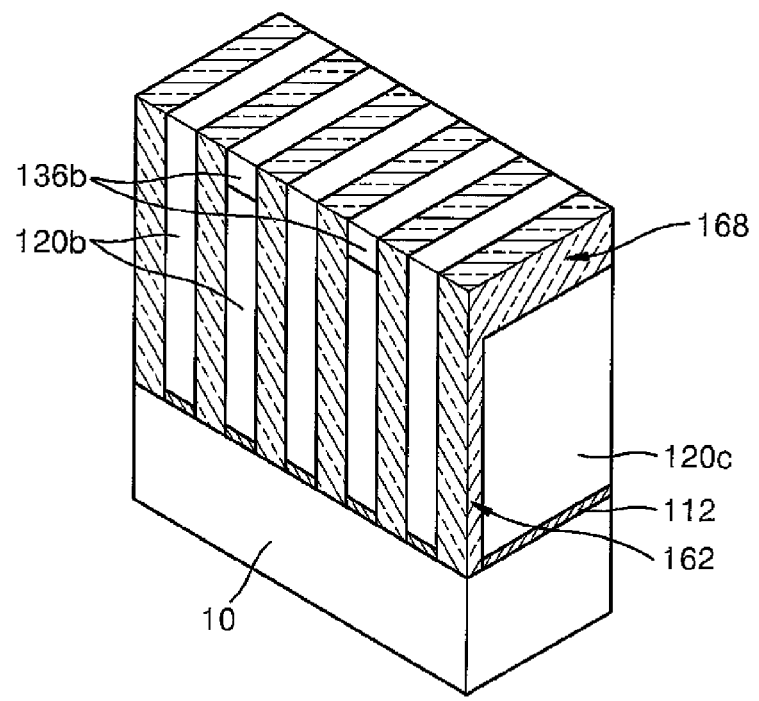

FIGS. 5A through 5E are cutaway perspective views illustrating a method of manufacturing a semiconductor device according to another embodiment of the invention. FIGS. 5A through 5E again illustrate the integral formation of direct contacts with associated bit lines. FIGS. 5A and 5B correspond to the region A of FIG. 1. FIGS. 5C through 5E correspond to the region B of FIG. 1.

The illustrated method of manufacturing a semiconductor device is approximately similar to the method described with reference to FIGS. 2A through 2L. In the former embodiments, upper contact holes 152 were first formed, and then line-shaped trenches 158. However, in the embodiment illustrated in FIGS. 5A through 5E, line-shaped trenches 158 are first formed, and then contact holes 152a are formed. In FIGS. 5A through 5F, reference numerals common to FIGS. 2A through 2L denote equivalent elements. Therefore, a detailed description of like parts will not be repeated.

Referring to FIG. 5A, according to the method as described with reference to FIGS. 2A through 2E, first etch stop insulating layer 112 and first interlayer insulating layer 120 are formed on semiconductor substrate 10. Then, composite hardmask pattern 130 is formed from first mask patterns 134 and second mask patterns 138a.

Thereafter, using composite hardmask pattern 130 as an etch mask, buffer insulating layer 136 and first interlayer insulating layer 120 are selectively etched to form a plurality of line-shaped trenches 558 extending in parallel with composite hardmask pattern 130.

Referring to FIG. 5B, a crossing mask pattern 540 is formed having an opening 540a partially exposing the upper surface of composite hardmask patterns 130 and the bottom surfaces of the line-shaped trenches 558.

A material forming crossing mask pattern 540 may be the same as that forming crossing mask pattern 140 described with reference to FIG. 2F.

Referring to FIG. 5C, using composite hardmask pattern 130 and crossing mask pattern 540 as an etch mask, first etch stop insulating layer 112 is used as an etch stop layer to etch the first interlayer insulating layer 120, thereby forming contact holes 552. First etch stop insulating layer 112 is partially exposed through the contact holes 552.

Referring to FIG. 5D, portions of first etch stop insulating layer 112 exposed through contact holes 552 are removed, and crossing mask pattern 540 and the composite hardmask pattern 130 are separately removed. Consequently, the interior surfaces of contact holes 552 and line-shaped trenches 558 are thoroughly exposed.

Additionally, the order of removing of first etch stop insulating layer 112 and crossing mask pattern 540, as well as composite hardmask pattern 130 is not fixed and may be reversed for convenience of processing.

Referring to FIG. 5E, according to the method as described with reference to FIG. 2L, contact holes 552 and line-shaped trenches 558 are filled with one or more conductive material (s) to integrally form contact plugs 162 and wiring layers 168.

Figure 6A:
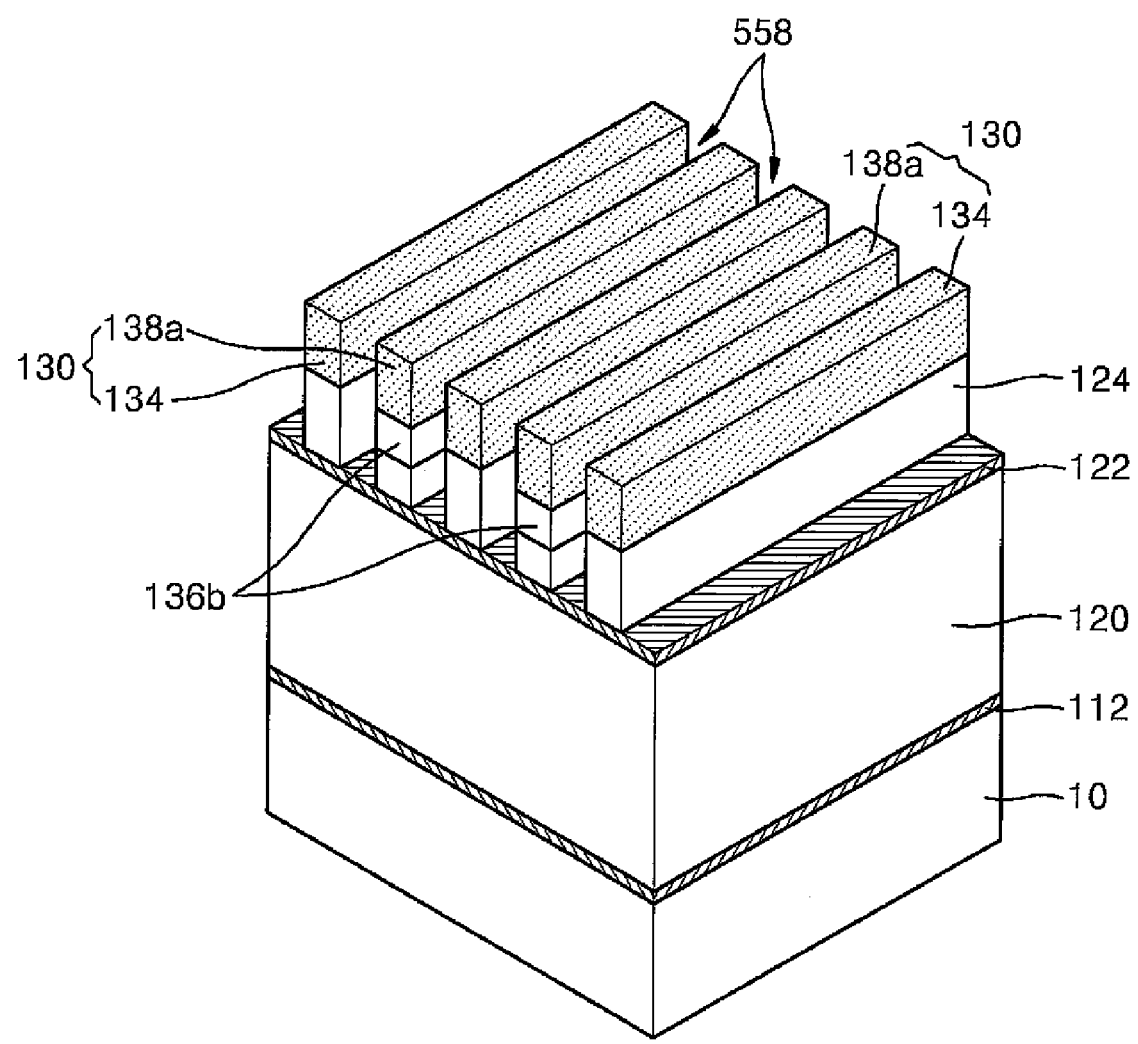
FIGS. 6A through 6E are cutaway perspective views illustrating a method of manufacturing a semiconductor device according to another embodiment of the invention.
Figure 6B:
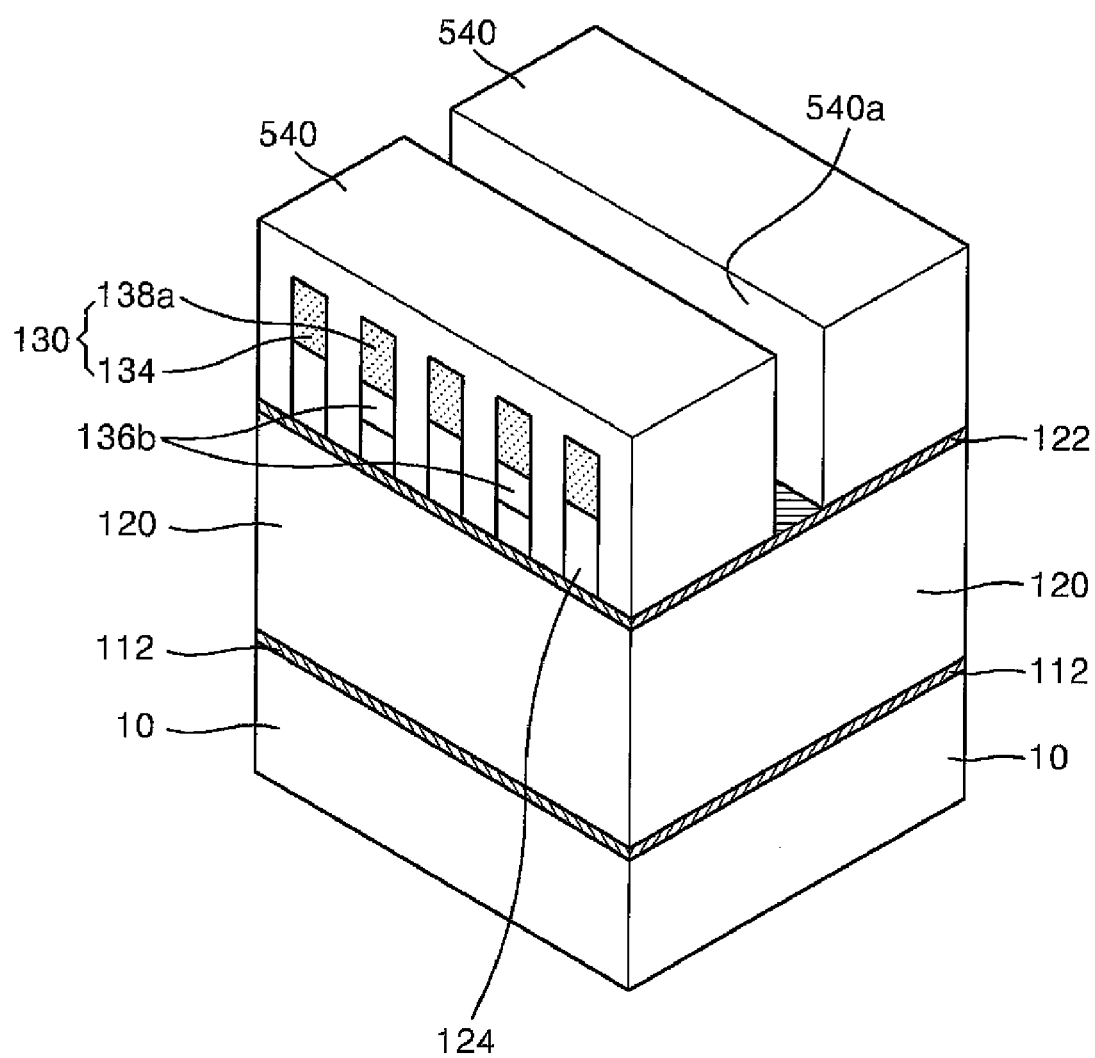
Figure 6C:
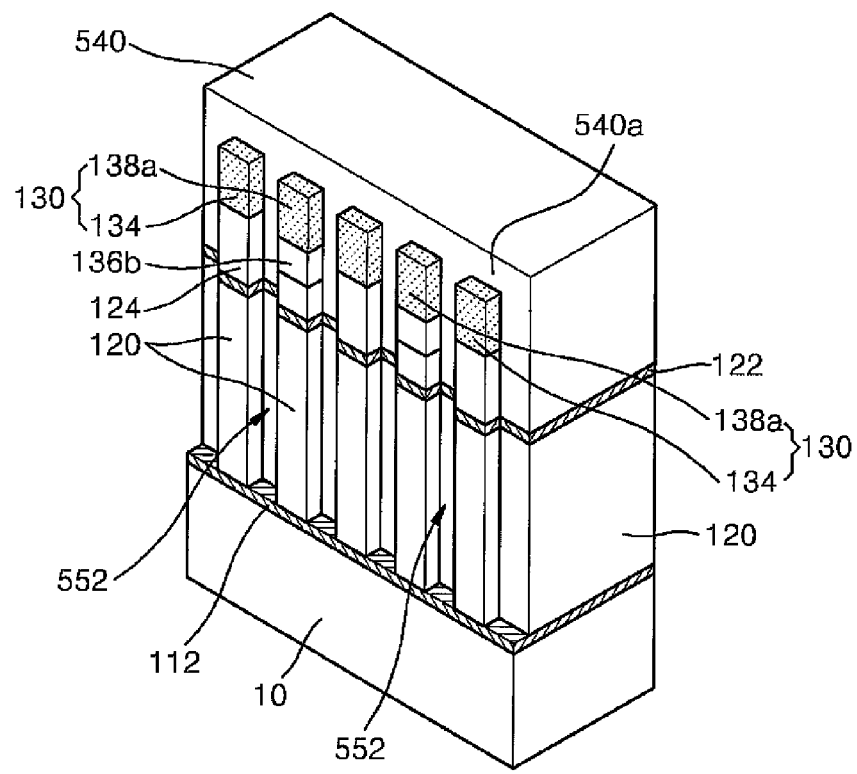
Figure 6D:
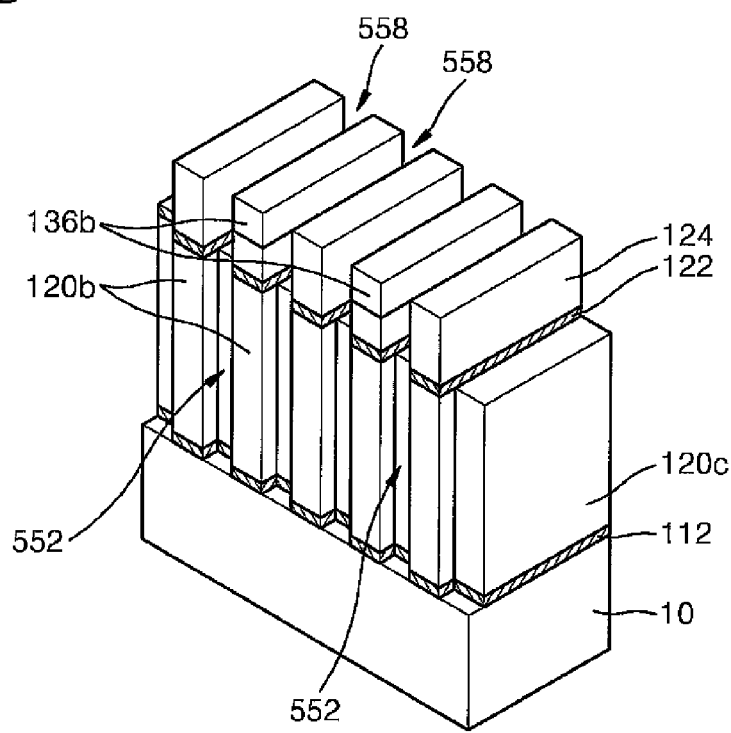
Figure 6E:
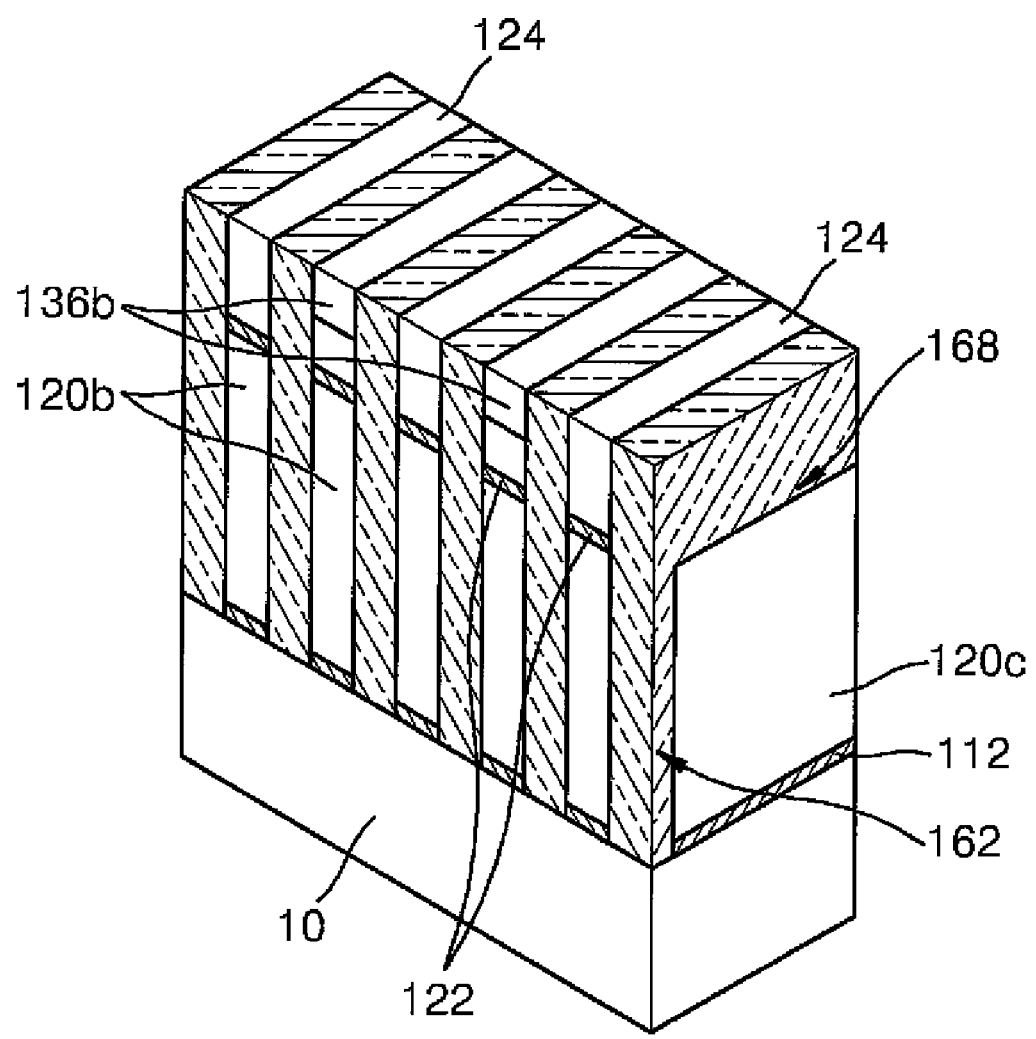

FIGS. 6A through 6E are cutaway perspective views sequentially illustrating a method of manufacturing a semiconductor device according to another embodiment of the invention. FIGS. 6A through 6E again illustrate the integral formation of direct contacts with associated bit lines. FIGS. 6A and 6B correspond to the region A of FIG. 1. FIGS. 6C through 6E correspond to the region B of FIG. 1.

The method of manufacturing the semiconductor device illustrated in FIGS. 6A through 6E is generally similar to the method described with reference to FIGS. 5A through 5E. In the illustrated embodiment, second etch stop insulating layer 122 is used as an etch stop layer when forming line-shaped trenches 558 (refer to FIG. 5A). In FIGS. 6A through 6E, reference numerals common to FIGS. 2A through 2L, 4A through 4E, and 5A through 5E denote equivalent elements. Therefore, a detailed description of like parts will not be repeated.

Referring to FIG. 6A, according to the method as described with reference to FIGS. 4A and 4B, first etch stop insulating layer 112, first interlayer insulating layer 120, second etch stop insulating layer 122, and second interlayer insulating layer 124 are sequentially formed on semiconductor substrate 10. Then, the plurality of first mask patterns 134 and buffer insulating layer 136 are formed on the resultant structure. Using these films, a plurality of second mask patterns 138a are formed on the buffer insulating layer 136 to form composite hardmask pattern 130 that includes first mask patterns 134 and the second mask patterns 138a.

Then, using composite hardmask pattern 130 as an etch mask and second etch stop insulating layer 122 as an etch stop layer, the residual portions of the buffer insulating layer 136b and second interlayer insulating layer 124 are etched to form a plurality of line-shaped trenches 558 extending in parallel with composite hardmask pattern 130.

Referring to FIG. 6B, according to the method as described with reference to FIG. 5B, a crossing mask pattern 540 having an opening 540a that partially exposes composite hardmask pattern 130 and bottom surfaces of line-shaped trenches 558 is formed.

Referring to FIG. 6C, using composite hardmask pattern 130 and crossing mask pattern 540 as an etch mask, the residual portions of the buffer insulating layer 136b, second interlayer insulating layer 120, and second etch stop insulating layer 122 are etched. Subsequently, using composite hardmask pattern 130 and crossing mask pattern 540 as an etch mask, first etch stop insulating layer 112 is used as an etch stop layer to etch first interlayer insulating layer 120, thereby forming contact holes 552. First etch stop insulating layer 112 is partially exposed through the contact holes 552.

Referring to FIG. 5D, removing selected portions of first etch stop insulating layer 112 exposed through contact holes 552, and then removing crossing mask pattern 540 and composite hardmask pattern 130 are separately performed. Consequently, the interior surfaces of contact holes 552 and line-shaped trenches 558 are completely exposed.

Also, as described with reference to FIG. 4E, when first etch stop insulating layer 112 exposed by contact holes 552 is removed under the state that second etch stop insulating layer 122 is exposed, portions of the second etch stop insulating layer 122 exposed by line-shaped trenches 558 are entirely removed while removing the first etch stop insulating layer 112 exposed by contact holes 552 if first etch stop insulating layer 112 and second etch stop insulating layer 122 are composed of the same material or materials having similar etch characteristics. Thus, first interlayer insulating layer 120 may be exposed by trenches 558 as illustrated in FIG. 6D.

Referring to FIG. 6E, according to the method as described with reference to FIG. 2L, contact holes 552 and line-shaped trenches 558 are filled with one or more conductive material(s) to form contact plugs 162 and wiring layers 168 having integrally formed structure within contact holes 552 and trenches 558.

As described with reference to FIG. 6D, if portions of second etch stop insulating layer 122 exposed by trenches 558 are entirely removed while first etch stop insulating layer 112 exposed by contact holes 552 is removed, bottom surfaces of wiring layers 168 directly contact the upper surface of first interlayer insulating layer 120 as illustrated in FIG. 6E. However, the present invention is not restricted to this particular feature. Although not illustrated, second etch stop insulating layer 122 may remain on first interlayer insulating layer 120 at the bottom surfaces of trenches 558 in some embodiments. Similarly, second etch stop insulating layer 122 may be interposed between first interlayer insulating layer 120 and wiring layers 168.

A semiconductor device according to various embodiments of the invention comprises a plurality of contact plugs that respectively penetrate through a plurality of contact holes formed at a fine pitch to connect a plurality of wiring layers (e.g., bit lines) to a plurality of conductive regions disposed on a semiconductor substrate. Each one of the plurality of contact plugs has a width that varies in accordance with its extension distance from the substrate in a first direction, and broadens as it approaches a contact region connecting a corresponding wiring layer. This aspect of certain embodiments of the invention reduces contact resistance between the contact plug and wiring layer. Nonetheless, the width of each contact plug in a second direction different from the first direction remains constant and may be accurately defined. The second-direction width of the contact plugs may be approximately equal to the width of the wiring layers. The plurality of contact plugs and the plurality of wiring layers may be integrally formed during a single step of depositing one or more conductive materials. Thus, even when the plurality of contact holes and wiring layers are closely formed with a very fine pitch, each contact plug will have a width equal to and well aligned with a corresponding wiring layer without risk of misalignment error. Accordingly, a highly integrated semiconductor device may be readily designed and manufactured.

Furthermore, in a method of forming fine patterns within a semiconductor device according to an embodiment of the invention, using double patterning, contact patterns formed with a fine pitch potentially exceeding the resolution limits of available photolithography equipment can be formed with excellent critical dimension uniformity. Particularly, in order to integrally form a plurality of contact plugs and wiring layers with very fine pitches, contact holes defining the contact plugs and line-shaped trenches defining the wiring layers may be effectively connected in well defined contact regions, and the contact holes and the trenches may be simultaneously filled with one or more conductive material(s). As such, since the locations of the ultimately formed contact holes are determined by hardmask patterns formed with a fine pitch by use of a double patterning process including a crossing mask pattern. In this manner, a layout defining the contact holes is readily facilitated, and the respective locations of the contact holes are easily aligned within the overall design of the semiconductor device. Therefore, efficient etching margins can be ensured. Moreover, the shape and arrangement of the various mask patterns used in the foregoing embodiments may be freely determined, so that contact holes and wiring layers of any reasonable design may be obtained.

While the present invention has been particularly shown and described with reference to exemplary embodiments thereof, it will be understood by those of ordinary skill in the art that various changes in form and details may be made therein without departing from the scope of the invention as defined by the following claims.

What is claimed is:

1. A method of manufacturing a semiconductor device, comprising:
    forming a first etch-stop insulating layer on a semiconductor substrate;
    forming an interlayer insulating layer on the first etch-stop insulating layer;
    forming a composite hardmask pattern in a first direction on the interlayer insulating film, wherein the composite hardmask pattern comprises residual portions of a buffer insulating film;
    forming a crossing mask pattern in a second direction different from the first direction on the composite hardmask pattern, wherein the crossing mask pattern comprises an opening selectively exposing portions of the residual portions of the buffer insulating film;
    using the combination of the composite hardmask pattern and the crossing mask pattern, etching the exposed portions of the residual portions of the buffer insulating layer to form contact holes to a depth leaving a residual separation thickness between bottom surfaces of the contact holes and the first etch-stop insulating layer;

removing the crossing mask pattern to expose residual etched portions of the interlayer insulating film;

etching the exposed residual etched portions of the interlayer insulating layer to form a plurality of line-shaped trenches and simultaneously removing the residual separation thickness to form a plurality of contact holes selectively exposing portions of the first etch-stop insulating layer;

filling the plurality of contact holes and the plurality of line-shaped trenches with at least one conductive material to simultaneously and integrally form a plurality of contact plugs in the plurality of contact holes, and a respectively connected plurality of wiring layers in the plurality of line-shaped trenches.

2. The method of claim 1, wherein forming the composite hardmask pattern on the interlayer insulating layer comprises:

forming a plurality of parallel first mask patterns on the interlayer insulating layer extending in the first direction and separated by a first pitch;

forming a buffer insulating layer to cover upper and sidewall portions of the plurality of first mask patterns and to form a plurality of parallel recessed regions;

forming an interleaving plurality of second mask patterns in the plurality of recessed regions and patterning the buffer insulating layer to form the residual portions of the buffer insulating film, wherein the plurality of first mask patterns, the plurality of second mask patterns, and the residual portions of the buffer insulating layer are formed in a self-aligned manner, and the plurality of first mask patterns and the plurality of second mask patterns are separated by a final pitch less than the first pitch.

3. The method of claim 2, wherein the buffer insulating layer has different etch characteristics in relation to a defined etch process than the material forming the plurality of first mask patterns and the plurality of second mask patterns.

4. The method of claim 1, wherein following etching of the exposed residual portions of the interlayer insulating film, each one of the etched residual portions of the interlayer insulating layer comprises a rounded shoulder portion defining a contact region.

5. The method of claim 4, wherein respective contact plugs and wiring layers are electrically connected through the contact region, such that the width of the contact plug in the first direction broadens as the contact plug extends from a lower section through a middle section to an upper section.

6. The method of claim 1, wherein the residual separation thickness is substantially equal to a desired thickness for the plurality of wiring layers.

7. The method of claim 1, wherein the first and second directions are orthogonal.

\* \* \* \* \*